(12) United States Patent
Jo et al.

(10) Patent No.: US 11,844,259 B2
(45) Date of Patent: Dec. 12, 2023

(54) DISPLAY APPARATUS

(71) Applicant: Samsung Display Co., Ltd., Yongin-si (KR)

(72) Inventors: Kangmoon Jo, Yongin-si (KR); Ansu Lee, Yongin-si (KR); Jungbae Song, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 404 days.

(21) Appl. No.: 17/245,591

(22) Filed: Apr. 30, 2021

(65) Prior Publication Data

US 2022/0013587 A1 Jan. 13, 2022

(30) Foreign Application Priority Data

Jul. 7, 2020 (KR) ......................... 10-2020-0083671

(51) Int. Cl.
*H10K 59/38* (2023.01)
*H10K 59/12* (2023.01)

(52) U.S. Cl.
CPC ............ *H10K 59/38* (2023.02); *H10K 59/12* (2023.02)

(58) Field of Classification Search
CPC ........... G02F 1/133509–133521; H10K 59/38; H10K 59/12; H10K 59/173; H10K 59/122; H10K 50/865; H10K 50/125
See application file for complete search history.

(56) References Cited

U.S. PATENT DOCUMENTS

| | | | |
|---|---|---|---|
| 9,673,263 B2 | 6/2017 | Ono et al. | |
| 10,297,194 B2 | 5/2019 | Kim | |
| 10,312,297 B2 | 6/2019 | Lee et al. | |
| 2017/0076678 A1* | 3/2017 | Lee | ........................ G02F 1/1336 |
| 2019/0013363 A1 | 1/2019 | Joo et al. | |
| 2019/0137815 A1 | 5/2019 | Kim et al. | |

FOREIGN PATENT DOCUMENTS

| | | |
|---|---|---|
| JP | 6314451 | 4/2018 |
| KR | 10-0790355 | 1/2008 |
| KR | 10-2018-0024910 | 3/2018 |
| KR | 10-2018-0036896 | 4/2018 |
| KR | 10-2019-0004874 | 1/2019 |
| KR | 10-2019-0050886 | 5/2019 |

* cited by examiner

*Primary Examiner* — Matthew C Landau
*Assistant Examiner* — Halee Cramer
(74) *Attorney, Agent, or Firm* — KILE PARK REED & HOUTTEMAN PLLC

(57) ABSTRACT

A display apparatus includes an upper substrate including a first area corresponding to a first light-emitting device; a second-color color filter layer on a lower surface of the upper substrate and including a first opening exposing the first area; a first-color color filter layer including a portion filling the first opening and a portion on a lower surface of the second-color color filter layer; a bank between the first-color and second-color color filter layers and a lower substrate, the bank including a second opening corresponding to the first area; and a first-color quantum dot layer filling the second opening, wherein the second opening includes a portion overlapping the first opening and a portion outside the first opening in a plan view.

36 Claims, 16 Drawing Sheets

DISPLAY APPARATUS

CROSS-REFERENCE TO RELATED APPLICATION(S)

This application claims priority to and the benefit of Korean Patent Application No. 10-2020-0083671 under 35 U.S.C. § 119, filed in the Korean Intellectual Property Office (KIPO) on Jul. 7, 2020, the entire contents of which are incorporated herein by reference.

BACKGROUND

1. Technical Field

The disclosure relates to a display apparatus, and more specifically, to a display apparatus having improved efficiency.

2. Description of Related Art

A display apparatus includes pixels. The pixels may emit different colors of light for implementing a full-color display apparatus. To this end, at least some pixels of the display apparatus have a color conversion unit. Accordingly, first-color light generated from a light-emitting portion of some pixels is converted into second-color light while passing through a corresponding color conversion unit and then passes to the outside. Conventional display apparatuses have a low optical efficiency.

SUMMARY

One or more embodiments include a display apparatus having an improved efficiency. However, the above technical features are examples, and the scope of the disclosure is not limited thereto.

Additional aspects will be set forth in part in the description which follows and, in part, will be apparent from the description, or may be learned by practice of the presented embodiments of the disclosure.

According to an embodiment, a display apparatus may include a lower substrate, a first light-emitting device on the lower substrate, the first light-emitting device including a second-color emission layer, an upper substrate above the lower substrate with the first light-emitting device disposed between the upper substrate and the lower substrate, the upper substrate including a first area corresponding to the first light-emitting device, a second-color color filter layer on a lower surface of the upper substrate, wherein the lower surface faces the lower substrate, and the second-color color filter layer may include a first opening exposing the first area, a first-color color filter layer including a portion filling the first opening and a portion on a lower surface of the second-color color filter layer, wherein the lower surface of the second-color color filter layer may face the lower substrate, a bank between the first-color and second-color color filter layers and the lower substrate, the bank including a second opening corresponding to the first area, and a first-color quantum dot layer filling the second opening, wherein the second opening may include a portion overlapping the first opening and a portion outside the first opening in a plan view.

The first opening may include a portion overlapping the second opening and a portion outside the second opening in the plan view.

Each of the first opening and the second opening may have a rectangular shape in the plan view.

Each of the first opening and the second opening may have a square shape in the plan view.

If the second opening is rotated by 45° about a center of the second opening, edges of the second opening may be parallel to edges of the first opening in the plan view.

If the second opening is rotated by 45° about a center of the second opening, edges of the second opening may correspond to edges of the first opening in the plan view.

The display apparatus may further include a second light-emitting device on the lower substrate, the second light-emitting device including a second-color emission layer, wherein the second-color color filter layer may overlap a second area of the upper substrate, the second area corresponding to the second light-emitting device, the first-color color filter layer may include a third opening corresponding to the second area, the bank may include a fourth opening corresponding to the second area, and the fourth opening may include a portion overlapping the third opening and a portion outside the third opening in the plan view.

The third opening may include a portion overlapping the fourth opening and a portion outside the fourth opening in the plan view.

Each of the third opening and the fourth opening may have a rectangular shape in the plan view.

Each of the third opening and the fourth opening may have a square shape in the plan view.

If the fourth opening is rotated by 45° about a center of the fourth opening, edges of the fourth opening may be parallel to edges of the third opening in the plan view.

If the fourth opening is rotated by 45° about a center of the fourth opening, edges of the fourth opening may correspond to edges of the third opening in the plan view.

The display apparatus may further include a third light-emitting device on the lower substrate, the third light-emitting device including a second-color emission layer, wherein the second-color color filter layer may include a fifth opening exposing a third area of the upper substrate, the third area corresponding to the third light-emitting device, the first-color color filter layer may include aســsixth opening corresponding to the third area, the bank may include a seventh opening corresponding to the third area, and the seventh opening may include a portion overlapping the fifth opening and a portion outside the fifth opening in the plan view.

The fifth opening may include a portion overlapping the seventh opening and a portion outside the seventh opening in the plan view.

Each of the fifth opening and the seventh opening may have a rectangular shape in the plan view.

Each of the fifth opening and the seventh opening may have a square shape in the plan view.

If the seventh opening is rotated by 45° about a center of the seventh opening, edges of the seventh opening may be parallel to edges of the fifth opening in the plan view.

If the seventh opening is rotated by 45° about a center of the seventh opening, edges of the seventh opening may correspond to edges of the fifth opening in the plan view.

An area of the sixth opening may be equal to or greater than an area of the fifth opening in the plan view.

Edges of the sixth opening may correspond to edges of the fifth opening in the plan view.

Edges of the fifth opening may be in the sixth opening in the plan view.

The display apparatus may further include a third-color color filter layer filling the fifth opening, and a third-color quantum dot layer filling the seventh opening.

The third-color color filter layer may include an eighth opening corresponding to the first area, and a ninth opening corresponding to the second area.

In the plan view, an area of the eighth opening may be equal to or greater than an area of the first opening, and an area of the ninth opening may be equal to or greater than an area of the third opening.

In the plan view, edges of the eighth opening may correspond to edges of the first opening, and edges of the ninth opening may correspond to edges of the third opening.

In the plan view, edges of the first opening may be in the eighth opening, and edges of the third opening may be in the ninth opening.

According to an embodiment, a display apparatus may comprise a lower substrate comprising a display area including a first edge, a second edge, a third edge, and a fourth edge, the second edge facing the first edge, the third edge connecting an end of the first edge to an end of the second edge, and the fourth edge connecting another end of the first edge to another end of the second edge; a first light-emitting device, a second light-emitting device, and a third light-emitting device in the display area on the lower substrate, each of the first to third light-emitting devices including an emission layer emitting light having a wavelength within a wavelength band; an upper substrate above the lower substrate with the first to third light-emitting devices disposed between the upper substrate and the lower substrate; a second-color color filter layer on a lower surface of the upper substrate, the lower surface of the upper substrate facing the lower substrate, wherein the second-color color filter layer may include a first opening overlapping the first light-emitting device and including edges that are not parallel to the first to fourth edges, and a second opening overlapping the third light-emitting device and including edges that are not parallel to the first to fourth edges; a first-color color filter layer on the lower surface of the upper substrate, wherein the first-color color filter layer may fill the first opening and may include a third opening and fourth opening, the third opening overlapping the second light-emitting device and including edges that are not parallel to the first to fourth edges in a plan view, the fourth opening overlapping the third light-emitting device and including edges that are not parallel to the first to fourth edges in the plan view; a third-color color filter layer on the lower surface of the upper substrate, the third-color color filter layer filling the second opening and the fourth opening; a bank between the first to third-color color filter layers and the lower substrate, and including a fifth opening, a sixth opening, and a seventh opening, wherein the fifth opening may overlap the first light-emitting device and may include edges that are parallel to the first to fourth edges in the plan view, a sixth opening may overlap the second light-emitting device and may include edges that are parallel to the first to fourth edges in the plan view, and a seventh opening may overlap the third light-emitting device and may include edges that are parallel to the first to fourth edges in the plan view; and quantum dot layers filling two of the fifth to seventh openings.

Each of the first to third light-emitting devices may include a second-color emission layer, and the quantum dot layers may comprise a first-color quantum dot layer filling the fifth opening and a third-color quantum dot layer filling the seventh opening.

A virtual straight line connecting a center of the first opening to a center of the second opening may not be parallel to the first and third edges.

At least one of the edges of the first opening and at least one of the edges of the second opening may be on a same virtual straight line, and the virtual straight line may not be parallel to the first and third edges.

At least one of the edges of the third opening may be on the virtual straight line.

The edges of the third opening may not be on the virtual straight line.

Each of the first opening, the second opening, the third opening, and the fourth opening may have a rectangular shape in the plan view.

If the fifth opening is rotated by 45° about a center of the fifth opening, edges of the fifth opening may be parallel to the edges of each of the first opening, the second opening, the third opening, and the fourth opening in the plan view.

An area of the second opening may be equal to an area of the first opening in the plan view.

An area of the second opening may be equal to an area of the third opening in the plan view.

Other aspects, features, and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
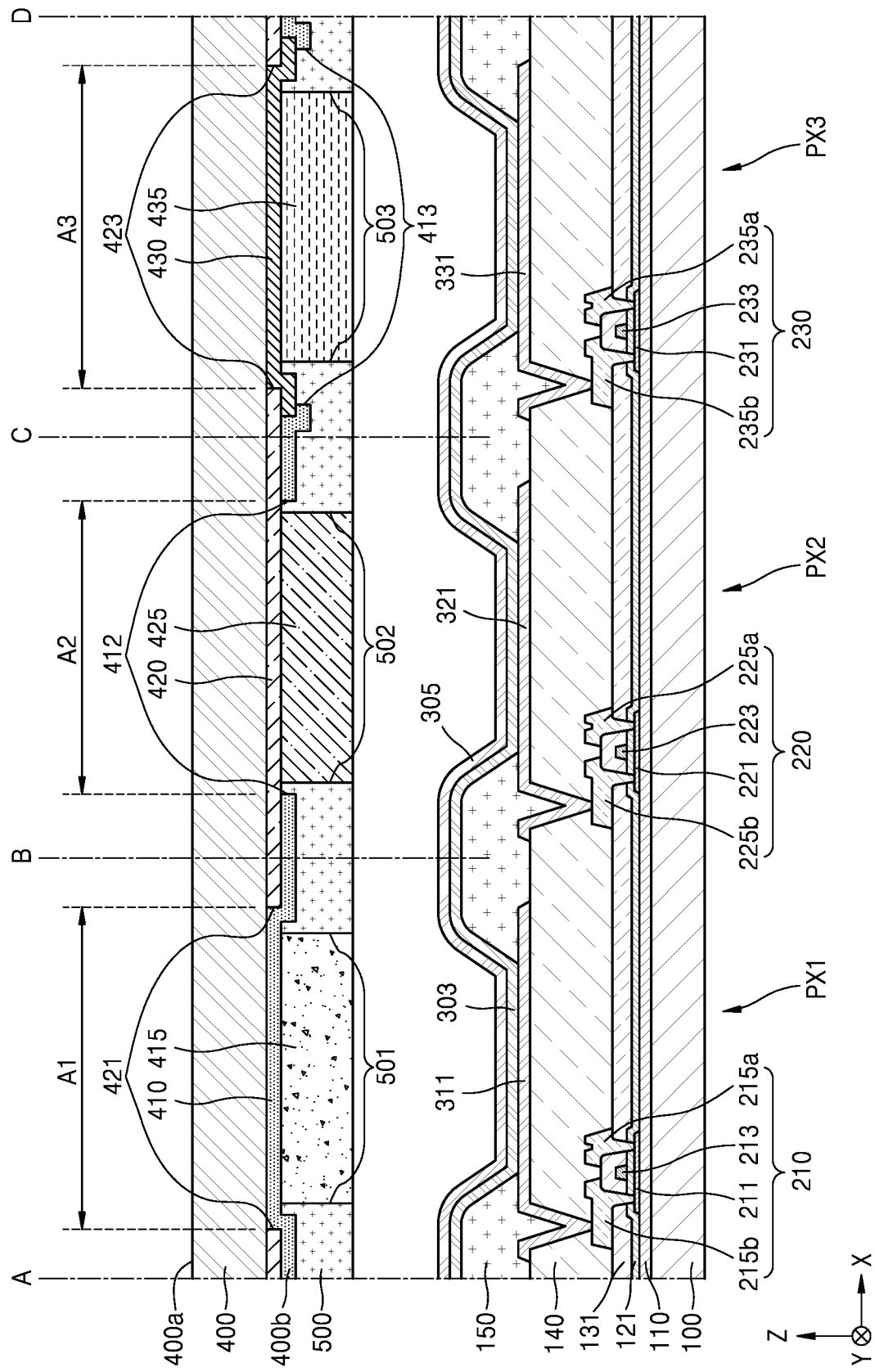
FIG. 1 is a schematic cross-sectional view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. In the specification and the claims, the phrase "at least one of" is intended to include the meaning of "at least one selected from the group of" for the purpose of its meaning and interpretation. For example, "at least one of A and B" may be understood to mean "A, B, or A and B."

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as being limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that when an element such as a layer, film, region or substrate is referred to as being placed "on" another element, it can be directly placed on the another element, or an intervening layer(s) may also be present. Sizes of components in the drawings may be exaggerated for convenience of explanation. In other words, because sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system and may be interpreted in a broader sense. For example, the x-axis, the y-axis, and the z-axis may be perpendicular to one another, or may represent different directions that are not perpendicular to one another.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined in the specification.

Figure 2:
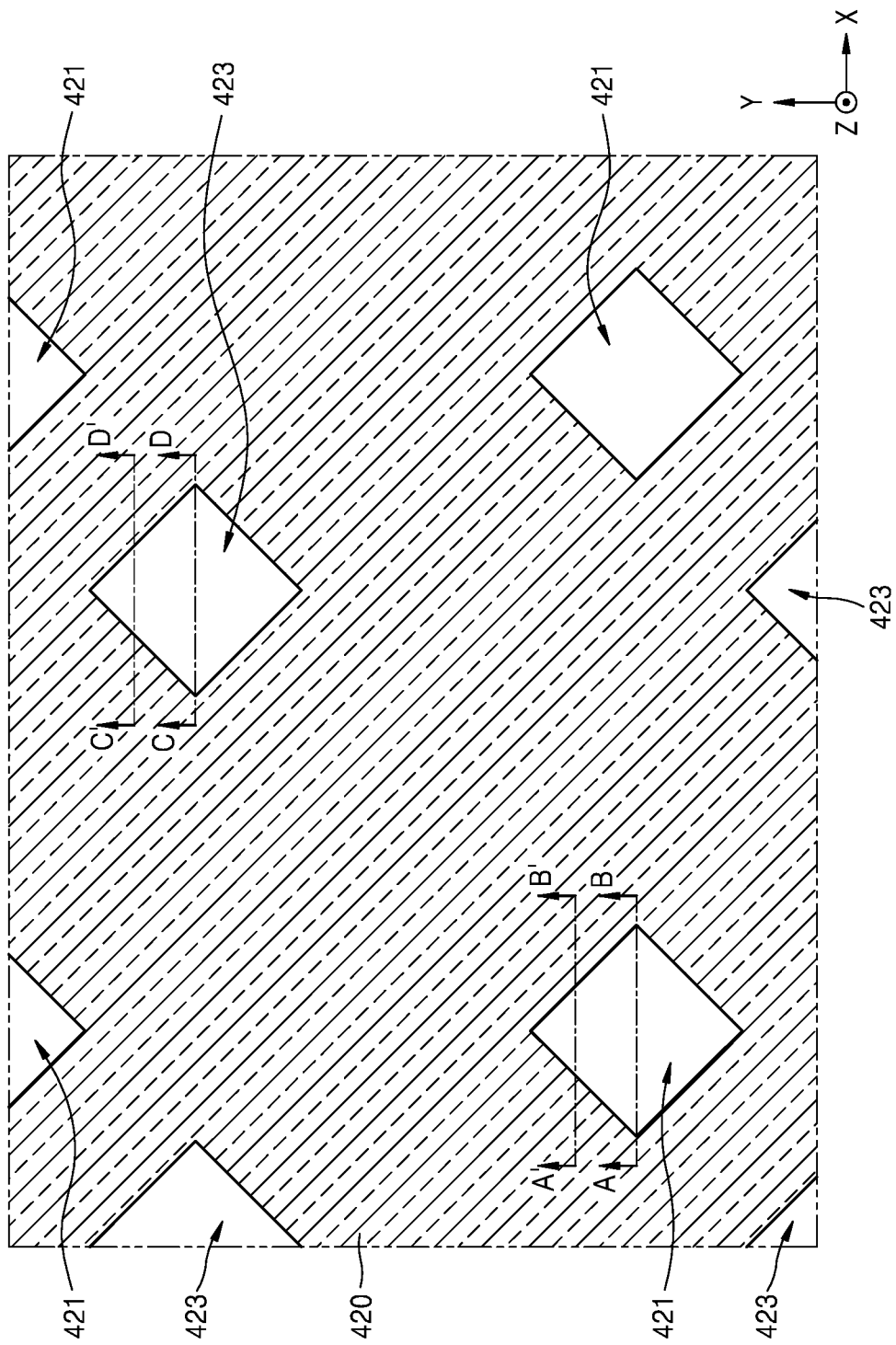
FIG. 2 is a schematic plan view showing a portion of the display apparatus of FIG. 1.
Figure 3:
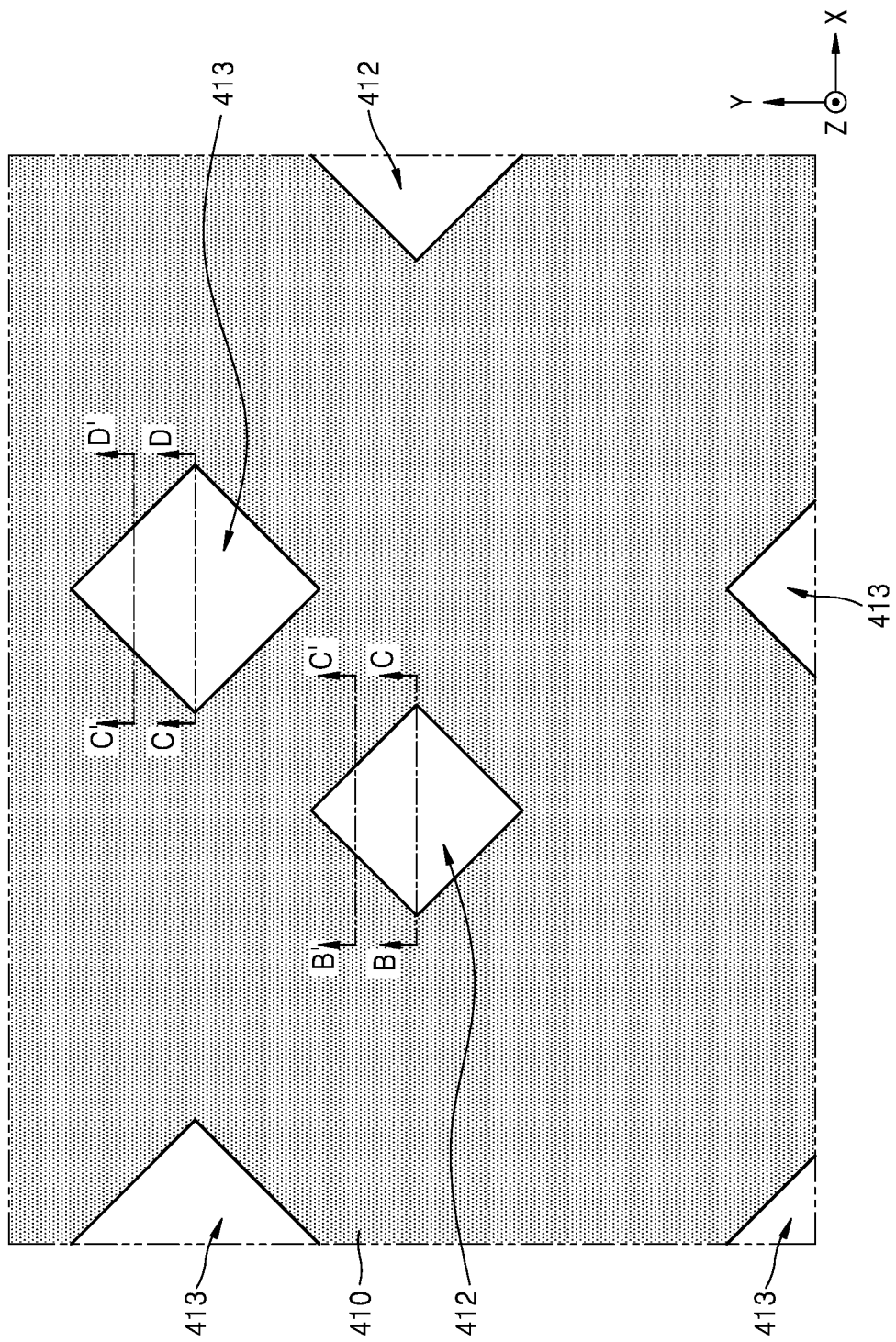
FIG. 3 is a schematic plan view showing another portion of the display apparatus of FIG. 1.
Figure 4:
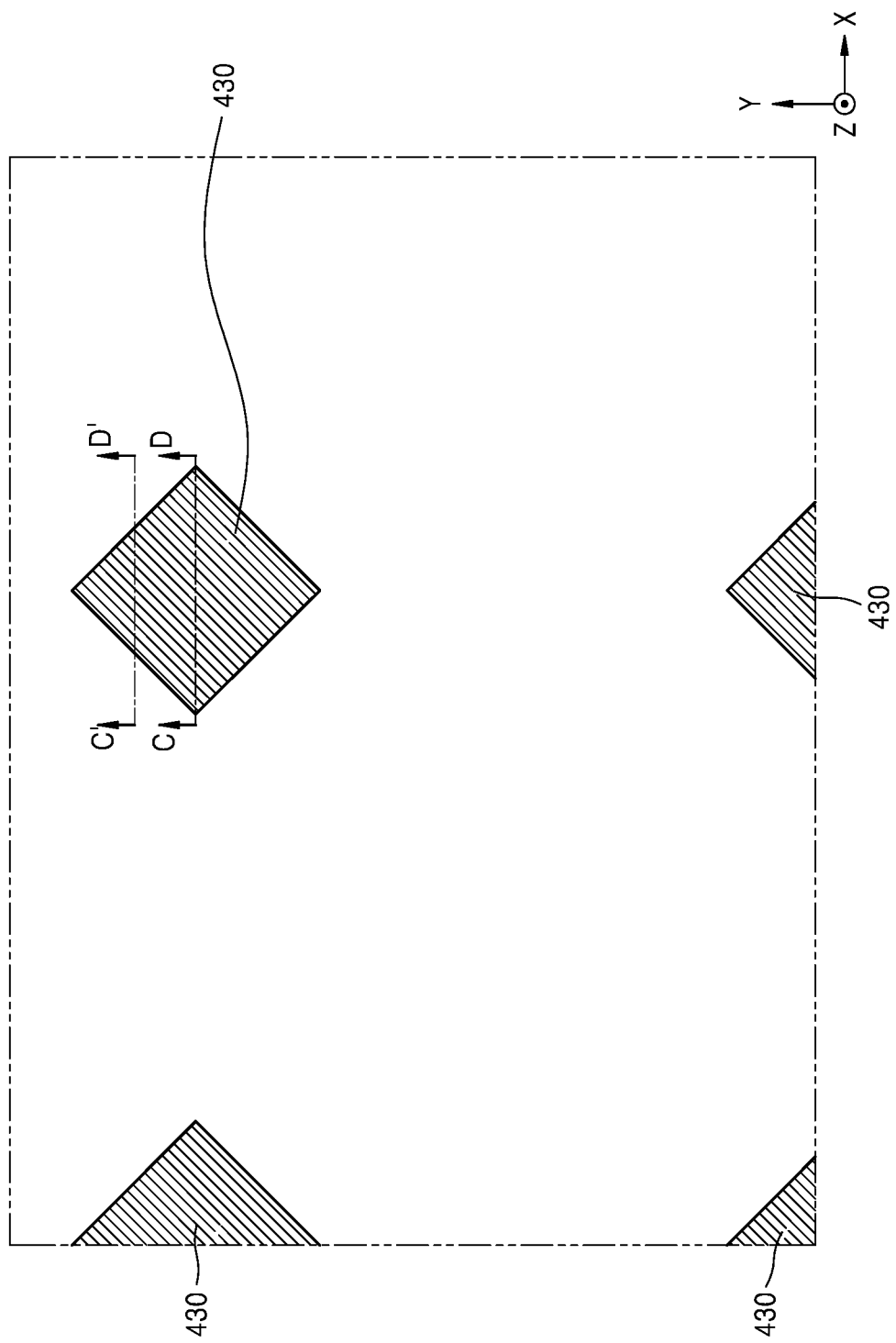
FIG. 4 is a schematic plan view showing another portion of the display apparatus of FIG. 1.
Figure 5:
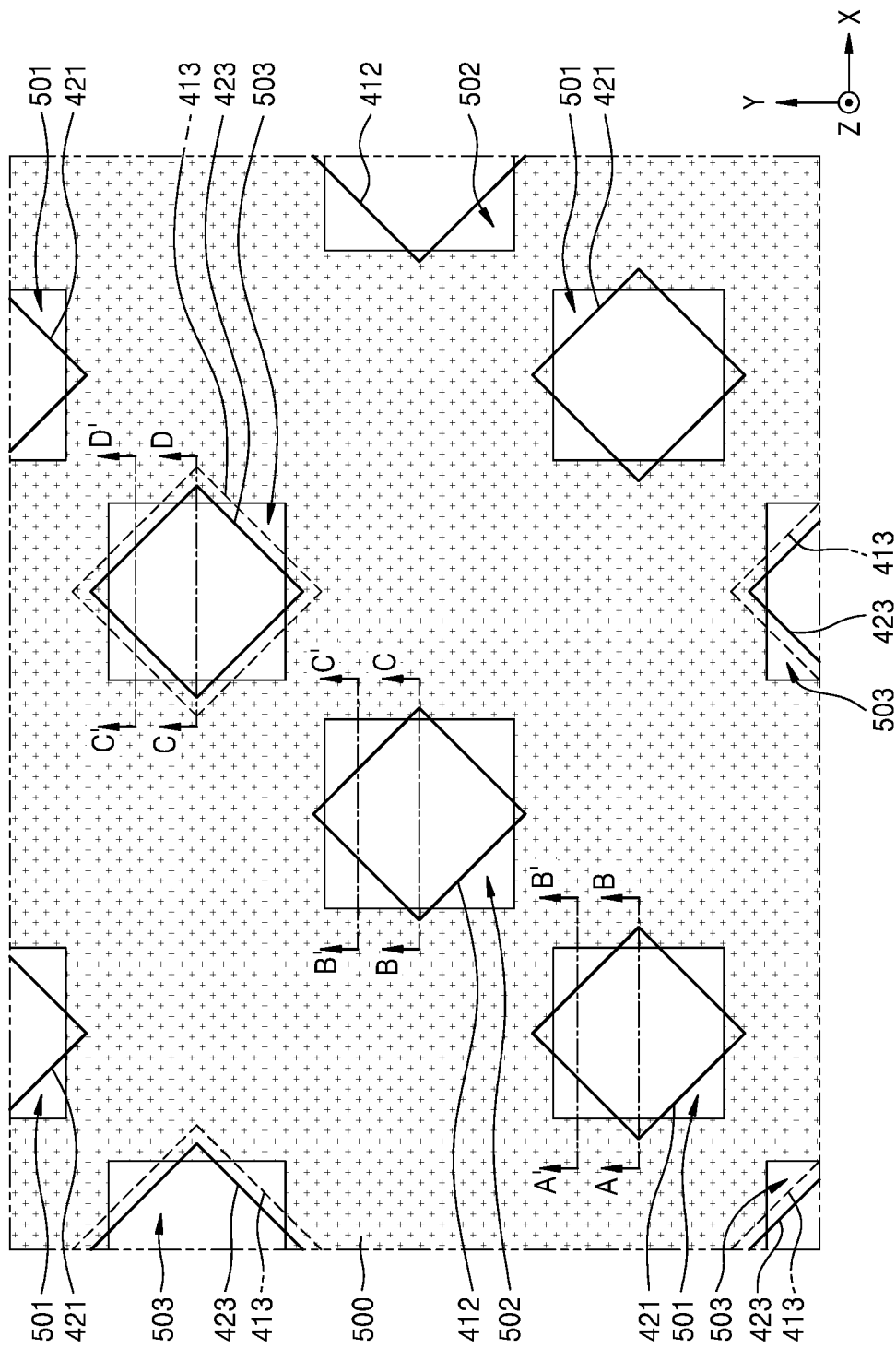
FIG. 5 is a schematic plan view showing a portion of the display apparatus of FIG. 1.

FIG. 1 is a schematic cross-sectional view of a display apparatus according to an embodiment, FIG. 2 is a schematic plan view showing a portion of the display apparatus of FIG. 1, FIG. 3 is a schematic plan view showing another portion of the display apparatus of FIG. 1, FIG. 4 is a schematic plan view showing another portion of the display apparatus of FIG. 1, and FIG. 5 is a schematic plan view showing a portion of the display apparatus of FIG. 1. FIG. 1 is a schematic cross-sectional view of the display apparatus taken along lines A-B, B-C, and C-D of FIGS. 2 to 5. FIG. 7 is a schematic cross-sectional view of the display apparatus taken along lines A-B', B'-C', and C'-D' of FIGS. 2 to 6.

The display apparatus according to the embodiment may include a lower substrate 100, a first light-emitting device on the lower substrate 100, an upper substrate 400, a first-color color filter layer 410, a second-color color filter layer 420, a bank 500, and a first-color quantum dot layer 415.

The lower substrate 100 may include glass, metal, or a polymer resin. In case that the lower substrate 100 is flexible or bendable, the lower substrate 100 may include a polymer resin such as a polyethersulfone, polyacrylate, polyetherimide, polyethylene naphthalate, polyethylene terephthalate, polyphenylene sulfide, polyarylate, polyimide, polycarbonate, or cellulose acetate propionate. The lower substrate 100 may be variously modified, and may have, for example, a multi-layered structure including two layers each having such a polymer resin and a barrier layer disposed between the two layers and including an inorganic material such as silicon oxide, silicon nitride, silicon oxynitride, and the like.

The first light-emitting device including a first pixel electrode 311 may be on the lower substrate 100. In addition to the first light-emitting device, a first thin-film transistor 210 electrically connected to the first light-emitting device may be on the lower substrate 100. As shown in FIGS. 1 and 7, in case that the first light-emitting device is electrically connected to the first thin-film transistor 210, the first pixel electrode 311 of the first light-emitting device may be electrically connected to the first thin-film transistor 210.

The first thin-film transistor 210 may include a first semiconductor layer 211, a first gate electrode 213, a first source electrode 215*a*, and a first drain electrode 215*b*, and the first semiconductor layer 211 may include amorphous silicon, polycrystalline silicon, an organic semiconductor material, or an oxide semiconductor material. The first gate electrode 213 may have various layered structures including various conductive materials, and may include, for example, a Mo layer and an Al layer. The first gate electrode 213 may have a layered structure including a Mo layer, an Al layer, or a Mo layer. The first gate electrode 213 may include a $TiN_x$ layer, an Al layer, and/or a Ti layer. The first source electrode 215*a* and the first drain electrode 215*b* may also have various layered structures including various conductive materials, e.g., a Ti layer, an Al layer, and/or a Cu layer. In this case, the first source electrode 215*a* and the first drain electrode 215*b* may each have a layered structure including a Ti layer, an Al layer, and a Ti layer.

To ensure an insulating property between the first semiconductor layer 211 and the first gate electrode 213, a gate insulating layer 121 including an inorganic material such as silicon oxide, silicon nitride, and/or silicon oxynitride may be between the first semiconductor layer 211 and the first gate electrode 213. An interlayer insulating layer 131 including an inorganic material such as silicon oxide, silicon nitride, and/or silicon oxynitride may be on the first gate electrode 213, and the first source electrode 215*a* and the first drain electrode 215*b* may be on the interlayer insulating layer 131. Insulating layers including the inorganic material may be obtained through a chemical vapor deposition (CVD) or an atomic layer deposition (ALD) method. This can also apply to embodiments and modifications thereof described below.

A buffer layer 110 including an inorganic material such as silicon oxide, silicon nitride, and/or silicon oxynitride may be between the first thin-film transistor 210 having the above structure and the lower substrate 100. The buffer layer 110 may increase the smoothness of an upper surface of the lower substrate 100, or may prevent or significantly reduce infiltration of impurities into the first semiconductor layer 211 of the first thin-film transistor 210 from the lower substrate 100.

A planarization layer 140 may be on the first thin-film transistor 210. For example, in case that an organic light-emitting device is on the first thin-film transistor 210 as the first light-emitting device as shown in FIGS. 1 and 7, the planarization layer 140 may planarize an upper portion of a protective layer covering the first thin-film transistor 210. The planarization layer 140 may include, for example, an organic material such as acryl, benzocyclobutene (BCB), or hexamethyldisiloxane (HMDSO). In FIGS. 1 and 7, the planarization layer 140 may have a single-layered structure but may be variously modified. For example, the planarization layer 140 may have a multi-layered structure.

The first light-emitting device may be on the planarization layer 140 on the lower substrate 100. In FIGS. 1 and 7, an organic light-emitting device as the first light-emitting device may be on the planarization layer 140. The first light-emitting device in a first pixel PX1 may include an organic light-emitting device including the first pixel electrode 311, an opposite electrode 305, and an intermediate layer 303 disposed between the first pixel electrode 311 and the opposite electrode 305 and including a second-color emission layer. The first pixel electrode 311 may be electrically connected to the first thin-film transistor 210 by contacting any one of the first source electrode 215a and the first drain electrode 215b via an opening formed in the planarization layer 140 or the like as shown in FIGS. 1 and 7. The first pixel electrode 311 may include a light-transmitting conductive layer including a light-transmitting conductive oxide, e.g., ITO, $In_2O_3$, or IZO, and a reflective layer including metal such as Al or Ag. For example, the first pixel electrode 311 may have a triple-layered structure including an ITO layer, an Ag layer, and an ITO layer.

The intermediate layer 303 including a second-color light emission layer may be patterned to correspond to the first pixel electrode 311 but may be also on a second pixel electrode 321 and a third pixel electrode 331 on the lower substrate 100 as shown in FIGS. 1 and 7 to be integrally formed over the first, second, and third pixel electrodes 311, 321, and 331. The opposite electrode 305 on the intermediate layer 303 may be also integrally formed over the first to third pixel electrodes 311 to 331. The opposite electrode 305 may include a light-transmitting conductive layer including ITO, $In_2O_3$, IZO, etc., and may include semi-transmissive layer including metal such as Al, Ag, etc. For example, the opposite electrode 305 may include a semi-transmissive layer including MgAg.

A pixel defining layer 150 may be on the planarization layer 140. The pixel defining layer 150 may include an opening corresponding to each of the pixels, e.g., an opening that exposes a center of the first pixel electrode 311, to define pixels. In the embodiments of FIGS. 1 and 7, the pixel defining layer 150 may increase a distance between an edge of the first pixel electrode 311 and the opposite electrode 305 to prevent generation of an arc at the edge of the first pixel electrode 311. The pixel defining layer 150 may include, for example, an organic material such as polyimide, hexamethyldisiloxane (HMDSO), etc.

The intermediate layer 303 may include a high- or low-molecular weight material. In case that the intermediate layer 303 includes a low-molecular weight material, the intermediate layer 303 may have a single- or multi-layered structure in which a hole injection layer (HIL), a hole transport layer (HTL), an emission layer (EML), an electron transport layer (ETL), and/or an electron injection layer (EIL) are stacked alone or in combination, and may be formed by a vacuum deposition method. In case that the intermediate layer 303 includes a high-molecular weight material, the intermediate layer 303 may have a structure including an HTL and an EML. The HTL may include PEDOT, and the EML may include a poly-phenylenevinylene (PPV)-based or polyfluorene-based polymer material. The intermediate layer 303 may be formed by a screen printing method, an inkjet printing method, a deposition method, a laser induced thermal imaging (LITI) method, or the like. However, the intermediate layer 303 is not limited thereto and may have various structures.

The intermediate layer 303 may include a layer integrally formed as a single body over the first to third pixel electrodes 311 to 331 as described above. However, if desired, the intermediate layer 303 may include a layer patterned to correspond to each of the first to third pixel electrodes 311 to 331. In either case, the intermediate layer 303 may include the second-color light emission layer. The second-color light emission layer may be integrally formed as a single body over the first to third pixel electrodes 311 to 331, but if desired, may be patterned to correspond to each of the first to third pixel electrodes 311 to 331. The second-color light emission layer may emit light in a second wavelength band, e.g., light having a wavelength within the range of about 450 nm to about 495 nm.

The opposite electrode 305 may be on the intermediate layer 303 to correspond to the first to third pixel electrodes 311 to 331. The opposite electrode 305 may be integrally formed as a single body over organic light-emitting devices.

The organic light-emitting device may be easily damaged by external moisture or oxygen, and thus an encapsulation layer (not shown) may cover or overlap the organic light-emitting device to protect the organic light-emitting device. The encapsulation layer may include a first inorganic encapsulation layer, an organic encapsulation layer, and a second inorganic encapsulation layer.

The upper substrate 400 may be above the lower substrate 100 such that the first light-emitting device having the first pixel electrode 311 may be between the upper substrate 400 and the lower substrate 100. The upper substrate 400 may include a polymer resin. The upper substrate 400 may include, for example, a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, or the like. The upper substrate 400 may be variously modified. For example, the lower substrate 100 may have a multi-layered structure including two layers each having the polymer resin and a barrier layer including an inorganic material such as silicon oxide, silicon nitride, silicon oxynitride, etc. between the two layers. The upper substrate 400 may be flexible or bendable. The upper substrate 400 may include a first area A1 corresponding to the first light-emitting device. In case that the first area A1 corresponds to the first light-emitting device, the first area A1 may overlap the first pixel electrode 311 when viewed in a direction (z-axis direction) perpendicular to the upper substrate 400 (or in a plan view).

The second-color color filter layer 420 may be on a lower surface 400b of the upper substrate 400 in the direction (z-axis direction) towards the lower substrate 100. The second-color color filter layer 420 may only transmit light having a wavelength of about 450 nm to about 495 nm. The second-color color filter layer 420 may serve to reduce external light reflection in the display apparatus. The second-color color filter layer 420 may include a 2-1-th opening 421 that exposes the first area A1, as shown in FIGS. 1, 2, and 7. The 2-1-th opening 421 may define an area of a first color pixel. This will be described below.

The first-color color filter layer 410 may only transmit light having a wavelength within a range of about 495 nm to about 570 nm. The first-color color filter layer 410 may include a portion on a lower surface of the second-color color filter layer 420 in the direction (z-axis direction) towards the lower substrate 100, and a portion filling the 2-1-th opening 421 of the second-color color filter layer 420. The portion of the first-color color filter layer 410, which fills the 2-1-th opening 421 of the second-color color filter layer 420, may be on the lower substrate 400b of the upper substrate 400 in the direction (z-axis direction) towards the lower substrate 100.

The bank 500 may be between the first- and second-color color filter layers 410 and 420 and the lower substrate 100. The bank 500 may include a first opening 501 corresponding to the first area A1. However, when viewed in the direction (z-axis direction) perpendicular to the lower surface 400b of the upper substrate 400, the first opening 501 of the bank 500 does not completely correspond to the first area A1. For example, when viewed in the direction (z-axis direction) perpendicular to the lower surface 400b of the upper substrate 400 (or in a plan view), the first opening 501 of the bank 500 may include a portion overlapping the 2-1-th opening 421 of the second-color color filter layer 420 and a portion outside the 2-1-th opening 421, as shown in FIG. 5. Accordingly, when viewed in the direction (z-axis direction) perpendicular to the lower surface 400b of the upper substrate 400, the 2-1-th opening 421 of the second-color color filter layer 420 may include a portion overlapping the first opening 501 of the bank 500 and a portion outside the first opening 501.

The first opening 501 of the bank 500 may correspond to the opening of the pixel defining layer 150, which defines the region of the first pixel PX1. However, as shown in FIG. 1, when viewed in the direction (z-axis direction) perpendicular to the upper surface 400a of the upper substrate 400, an area of the first opening 501 of the bank 500 may be greater than that of the opening of the pixel defining layer 150 defining the region of the first pixel PX1. For example, in case that the first opening 501 of the bank 500 corresponds to the opening of the pixel defining layer 150, which defines the region of the first pixel PX1, a shape of a boundary of the first opening 501 in the bank 500 may be identical or similar to a shape of a boundary of the opening in the pixel defining layer 150, which defines the region of the first pixel PX1, when viewed in the direction (z-axis direction) perpendicular to the upper surface 400a of the upper substrate 400.

The bank 500 may include various materials, for example, an inorganic material such as silicon oxide, silicon nitride, and/or silicon oxynitride. If desired, the bank 500 may include a photoresist material, and thus the bank 500 may be easily formed by any process(es) such as an exposure, a development, etc.

The first-color quantum dot layer 415 may fill the first opening 501 of the bank 500. The first-color quantum dot layer 415 may convert the light in the second wavelength band generated by the intermediate layer 303 on the first pixel electrode 311 into light in a first wavelength band. For example, in case that the intermediate layer 303 on the first pixel electrode 311 generates light having a wavelength within a range of about 450 nm to about 495 nm, the first-color quantum dot layer 415 may convert the light into light having a wavelength within a range of about 495 nm to about 570 nm. Accordingly, the light having a wavelength within the range of about 495 nm to about 570 nm may be emitted from the first pixel PX1 to the outside via the upper substrate 400.

The first-color quantum dot layer 415 may have a structure in which quantum dots are distributed in a resin. The quantum dots may include a semiconductor material such as cadmium sulfide (CdS), cadmium telluride (CdTe), zinc sulfide (ZnS), or indium phosphide (InP). Each of the quantum dots may have a size of several nanometers, and the wavelength of light after conversion may vary depending on the size of the quantum dot. The first-color quantum dot layer 415 may include any type of resin, provided that the resin is a light-transmitting material. For example, a polymer resin such as acryl, benzocyclobutene (BCB), or hexamethyldisiloxane (HMDSO) may be used as a material for forming the first-color quantum dot layer 415. The material for forming the first-color quantum dot layer 415 may be in the first opening 501 of the bank 500 by an inkjet printing method.

Figure 6:
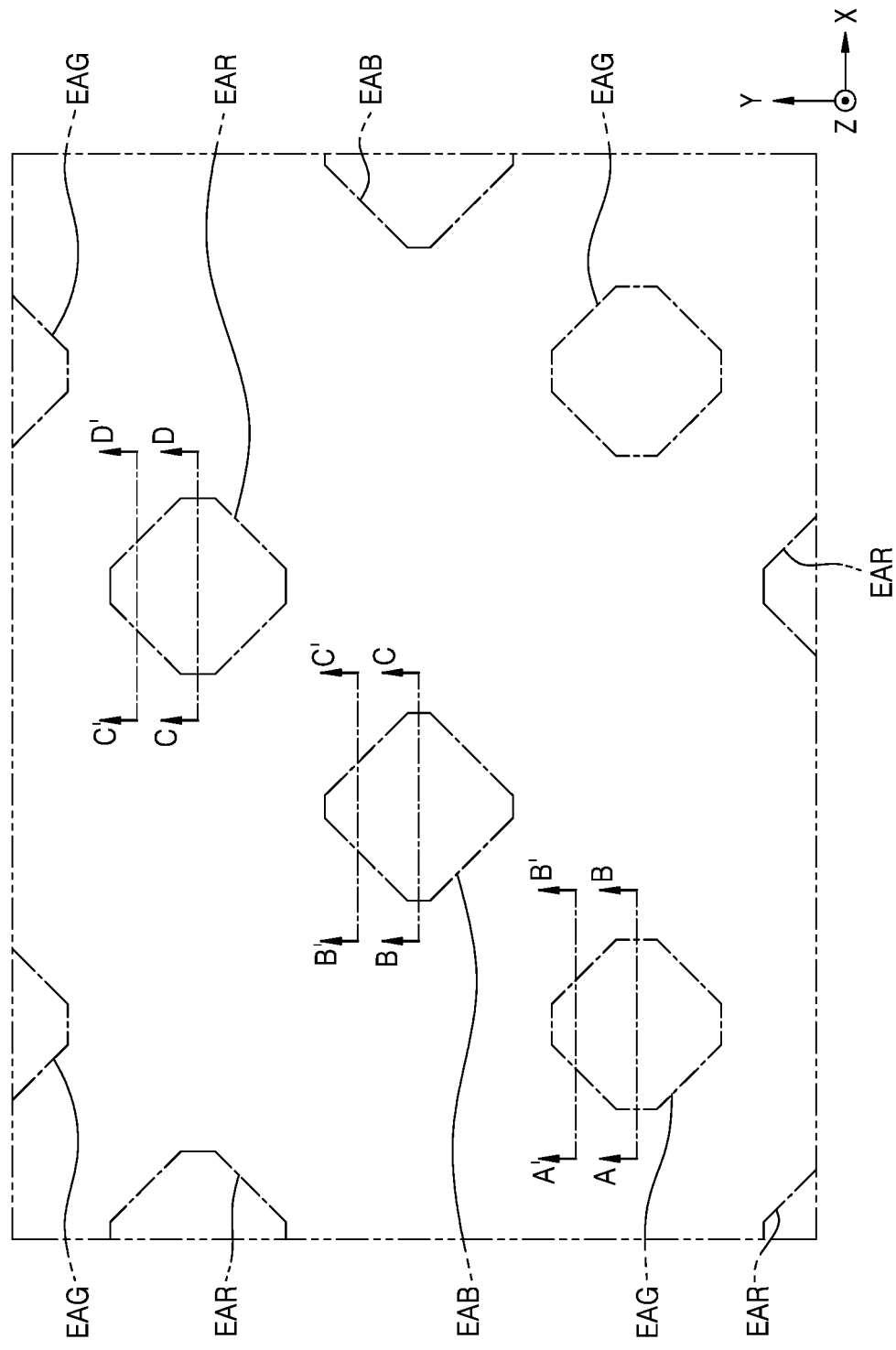
FIG. 6 is a schematic conceptual diagram showing light extraction regions from a side of a user of the display apparatus of FIG. 1.
Figure 7:
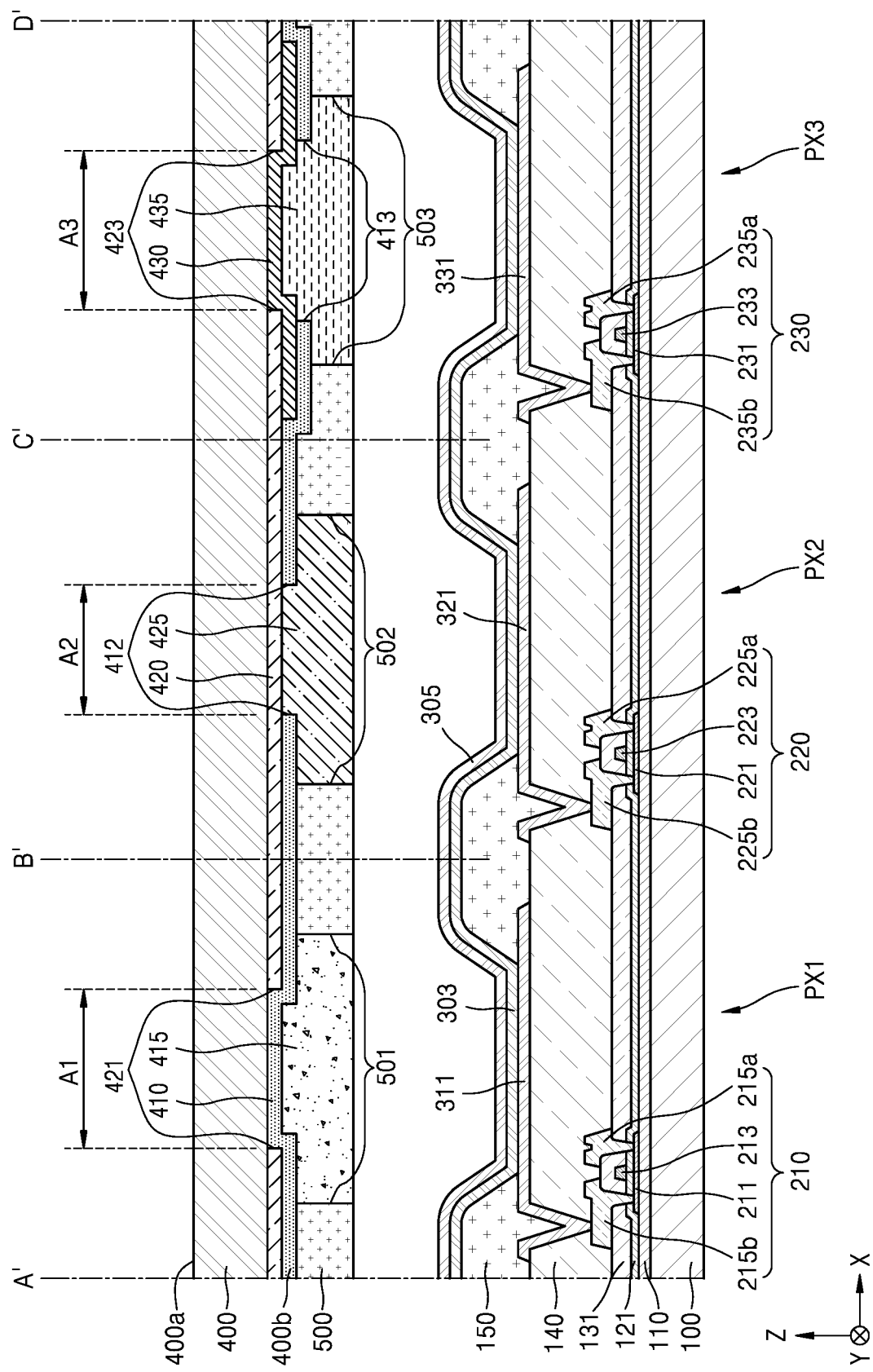
FIG. 7 is a schematic cross-sectional view of the display apparatus taken along lines A'-B', B'-C', and C'-D' of FIGS. 2 to 6.

FIG. 6 is a schematic conceptual diagram showing light extraction regions EAG from a perspective of a user of the display apparatus of FIG. 1 and FIG. 7. FIG. 6 shows light extraction regions EAG in the first pixel PX1 when viewed from the upper surface 400a of the upper substrate 400. As shown in FIG. 6, the light extraction region EAG in the first pixel PX1 may have an octagonal shape.

As a result of experiments under different conditions, it can be seen that the optical efficiency was the highest in case that a length of an edge of the light extraction region EAG is the smallest in each pixel (or sub-pixel) using the quantum dot layer in the display apparatus. To minimize the length of the edge of the light extraction region EAG while the area of the light extraction region is consistent, the light extraction region EAG may be circular in a plan view. However, it is not easy to manufacture the light extraction region EAG to have a circular shape in a plan view during a manufacturing processes of the display apparatus.

The display apparatus according to the embodiment may include the light extraction region EAG having a substantially octagonal shape in the first pixel PX1 in which the first light-emitting device is located when the light extraction region EAG is viewed from the upper surface 400a of the upper substrate 400. The light extraction region EAG in the first pixel PX1 may be defined as a portion in which the 2-1-th opening 421 of the second-color color filter layer 420 and the first opening 501 of the bank 500 overlap each other. The first-color quantum dot layer 415 may be in the first opening 501 of the bank 500 to convert the light emitted from the second-color light emission layer of the first light-emitting device including the first pixel electrode 311 into the light of the first wavelength band, and then, the converted light may be discharged to the outside only through the 2-1-th opening 421 of the second-color color filter layer 420. Therefore, the display apparatus according to the embodiment may include the light extraction region EAG having an octagonal shape similar to a circular shape in the first pixel PX1, in which the first light-emitting device is provided, when viewed from the upper surface 400a of the upper substrate 400 (or in a plan view). Therefore, the length of the edges of the light extraction region EAG in the first pixel PX1 may be reduced to increase the optical efficiency.

As described above, in order for the light extraction region EAG in the first pixel PX1, in which the first light-emitting device is located, to have a (roughly or substantially) octagonal shape similar to a circular shape when viewed in the direction perpendicular to the upper surface 400a of the upper substrate 400, each of the 2-1-th opening 421 of the second-color color filter layer 420 and the first opening 501 of the bank 500 may have a quadrangular shape when viewed in the direction (z-axis direction) perpendicular to the lower surface 400b of the upper substrate 400. As shown in FIGS. 2 and 5, when viewed in the direction (z-axis direction) perpendicular to the lower surface 400b of the upper substrate 400, the 2-1-th opening 421 of the second-color color filter layer 420 and the first opening 501 of the bank 500 may each have a square shape. When viewed in the direction (z-axis direction) perpendicular to the lower surface 400b of the upper substrate 400, edges of the 2-1-th opening 421 of the second-color color filter layer 420 may be parallel to the edges of the first opening 501 of the bank 500 if the first opening 501 of the bank 500 is rotated by 45° about a center of the first opening 501. Therefore, when viewed in the direction perpendicular to the upper surface 400a of the upper substrate 400, the light extraction region EAG of the first pixel PX1, in which the first light-emitting device is located, may have an octagonal shape similar to a circular shape.

As shown in FIGS. 1 and 7, the display apparatus according to the embodiment may include a second light-emitting device in a second pixel PX2. The second light-emitting device may include an organic light-emitting device including the second pixel electrode 321, the opposite electrode 305, and the intermediate layer 303 disposed between the second pixel electrode 321 and the opposite electrode 305 and including a second-color emission layer. In addition to the second light-emitting device, a second thin-film transistor 220 electrically connected to the second light-emitting device may be on the lower substrate 100. The second thin-film transistor 220 may include a second drain electrode 225b, a second semiconductor layer 221, a second gate electrode 223, and a second source electrode 225a. As shown in FIGS. 1 and 7, in case that the second light-emitting device is electrically connected to the second thin-film transistor 220, the second pixel electrode 321 of the second light-emitting device may be electrically connected to the second thin-film transistor 220. The above descriptions of the first pixel electrode 311 and the first thin-film transistor 210 may also apply the second pixel electrode 321 and the second thin-film transistor 220.

The second-color color filter layer 420 may cover or overlap a second area A2 corresponding to the second light-emitting device of the upper substrate 400. In case that the second area A2 corresponds to the second light-emitting device, the second area A2 may overlap the second pixel electrode 321 when viewed in the direction (z-axis direction) perpendicular to the upper substrate 400. The first-color color filter layer 410 may include a 1-2-th opening 412 corresponding to the second area A2. The bank 500 may include a second opening 502 corresponding to the second area A2. When viewed in the direction (z-axis direction) perpendicular to the lower surface 400b of the upper substrate 400, the second opening 502 of the bank 500 may include a portion overlapping the 1-2-th opening 412 of the first-color color filter layer 410 and a portion outside the 1-2-th opening 412. Accordingly, when viewed in the direction (z-axis direction) perpendicular to the lower surface 400b of the upper substrate 400, the 1-2-th opening 412 of the first-color color filter layer 410 may include a portion overlapping the second opening 502 of the bank 500 and a portion outside the second opening 502.

The second-color light emission layer included in the intermediate layer 303 of the second pixel PX2 may emit light in a second wavelength band within a range of, e.g., about 450 nm to about 495 nm. The second pixel PX2 may emit the light in the second wavelength band to the outside through the upper substrate 400 without conversion. Therefore, the second pixel PX2 may not include a quantum dot layer. As described above, because the quantum dot layer may not be included in the second opening 502 of the bank 500, a light transmission layer (e.g., a transparent layer) 425 including a light-transmitting resin may be in the second opening 502. The light transmission layer 425 may include acryl, benzocyclobutene (BCB), or hexamethyldisilioxane (HMDSO). If desired, distinguishable from FIGS. 1 and 7, the light transmission layer 425 may not be in the second opening 502 of the bank 500.

FIG. 6 is a schematic conceptual diagram showing light extraction regions EAB from a perspective of a user of the display apparatus of FIG. 1 and FIG. 7. For example, FIG. 6 shows light extraction regions EAB in the second pixel PX2 when viewed from the upper surface 400a of the upper substrate 400. As shown in FIG. 6, the light extraction region EAB in the second pixel PX2 may have an octagonal shape (or substantially octagonal shape).

As a result of experiments under different conditions, it can be seen that the optical efficiency was the highest in case that a length of an edge of the light extraction region EAB is the smallest in each pixel (or sub-pixel) using the quantum dot layer in the display apparatus. To minimize the length of the edge of the light extraction region EAB while the area of the light extraction region is consistent, the light extraction region EAB may be circular in a plan view. However, it is not easy to manufacture the light extraction region EAB to have a circular shape in a plan view during the manufacturing processes of the display apparatus.

The display apparatus according to the embodiment may include the light extraction region EAB having an octagonal shape in the second pixel PX2 in which the second light-emitting device is located when viewed from the upper surface 400a of the upper substrate 400. The light extraction region EAB in the second pixel PX2 may be defined as a portion in which the 1-2-th opening 412 of the first-color color filter layer 410 and the second opening 502 of the bank 500 overlap each other. The light emitted from the second-color light emission layer located below the 1-2-th opening 412 and the second opening 502 may proceed toward the upper substrate 400 via the second opening 502 of the bank 500, and the light may be only discharged to the outside through the 1-2-th opening 412 of the first-color color filter layer 410. Therefore, the display apparatus according to the embodiment may include the light extraction region EAB having an octagonal shape similar to a circular shape of the second pixel PX2 in which the second light-emitting device is provided when viewed from the upper surface 400a of the upper substrate 400. Accordingly, the length of the edge of the light extraction region EAB in the second pixel PX2 may be reduced to increase the optical efficiency.

As described above, for the light extraction region EAB in the second pixel PX2, in which the second light-emitting device is located, to have an (roughly or substantially) octagonal shape similar to a circular shape when viewed in the direction perpendicular to the upper surface 400a of the upper substrate 400, each of the 1-2-th opening 412 of the first-color color filter layer 410 and the second opening 502 of the bank 500 may have a rectangular shape when viewed in the direction (z-axis direction) perpendicular to the lower surface 400b of the upper substrate 400. As shown in FIGS. 3 and 5, when viewed in the direction (z-axis direction) perpendicular to the lower surface 400b of the upper substrate 400, the 1-2-th opening 412 of the first-color color filter layer 410 and the second opening 502 of the bank 500 may each have a square shape. When viewed in the direction (z-axis direction) perpendicular to the lower surface 400b of the upper substrate 400, an edge of the 1-2-th opening 412 of the first-color color filter layer 410 may be parallel to the edge of the second opening 502 of the bank 500 if the first-color color filter layer 410 is rotated by 45° about a center of the second opening 502. Therefore, when viewed in the direction perpendicular to the upper surface 400a of the upper substrate 400, the light extraction region EAB in the second pixel PX2, in which the second light-emitting device is located, may have an octagonal shape similar to a circular shape.

As shown in FIGS. 1 and 7, the display apparatus according to the embodiment may have a third light-emitting device in a third pixel PX3. The third light-emitting device may include an organic light-emitting device including the third pixel electrode 331, the opposite electrode 305, and the intermediate layer 303 disposed between the third pixel electrode 331 and the opposite electrode 305 and including the second-color light emission layer. In addition to the third light-emitting device, a third thin-film transistor 230 electrically connected to the third light-emitting device may be on the lower substrate 100. The third thin-film transistor 230 may include a third drain electrode 235b, a third semiconductor layer 231, a third gate electrode 233, and a third source electrode 235a. As shown in FIGS. 1 and 7, in case that the third light-emitting device is electrically connected to the third thin-film transistor 230, the third pixel electrode 331 of the third light-emitting device may be electrically connected to the third thin-film transistor 230. The above descriptions of the first pixel electrode 311 and the first thin-film transistor 210 may also apply to those of the third pixel electrode 331 and the third thin-film transistor 230.

As shown in FIG. 2, the second-color color filter layer 420 may include a 2-3-th opening 423 that exposes a third area A3 corresponding to the third light-emitting device of the upper substrate 400. In case that the third area A3 corresponds to the third light-emitting device, the third area A3 may overlap the third pixel electrode 331 when viewed in the direction (z-axis direction) perpendicular to the upper substrate 400. The first-color color filter layer 410 may also include a 1-3-th opening 413 corresponding to the third area A3 as shown in FIG. 3. A third-color color filter layer 430 may fill the 2-3-th opening 423 of the second-color color filter layer 420 as shown in FIGS. 1, 4, and 7. It may be understood that the third-color color filter layer 430 fills the 1-3-th opening 413 of the first-color color filter layer 410. The third-color color filter layer 430 may only transmit light having a wavelength within a range of about 630 nm to about 780 nm.

The bank 500 may include a third opening 503 corresponding to the third area A3 as shown in FIG. 5. When viewed in the direction (z-axis direction) perpendicular to the lower surface 400b of the upper substrate 400, the third opening 503 of the bank 500 may include a portion overlapping the 2-3-th opening 423 of the second-color color filter layer 420 and a portion outside the 2-3-th opening 423. Accordingly, when viewed in the direction (z-axis direction) perpendicular to the lower surface 400b of the upper substrate 400, the 2-3-th opening 423 of the second-color color filter layer 420 may include a portion overlapping the third opening 503 of the bank 500 and a portion outside the third opening 503.

A third-color quantum dot layer 435 may fill the third opening 503 of the bank 500. The third-color quantum dot layer 435 may convert the light in the second wavelength band generated by the intermediate layer 303 on the third pixel electrode 331 into light in a third wavelength band. For example, in case that light having a wavelength within the range of about 450 nm to about 495 nm is generated from the intermediate layer 303 on the third pixel electrode 331, the third-color quantum dot layer 435 may convert the light into light having a wavelength within the range of about 630 nm to about 780 nm. Accordingly, the light having a wavelength within the range of about 630 nm to about 780 nm may be emitted from the third pixel PX3 to the outside via the upper substrate 400.

The third-color quantum dot layer 435 may have a structure in which quantum dots are distributed in a resin. The quantum dots may include a semiconductor material such as cadmium sulfide (CdS), cadmium telluride (CdTe), zinc sulfide (ZnS), or indium phosphide (InP). Each of the quantum dots may have a size of several nanometers, and the wavelength of the light after conversion may vary depending on the size of the quantum dot. The third-color quantum dot layer 435 may include any type of resin, provided that the resin is a light-transmitting material. For example, a polymer resin such as acryl, benzocyclobutene (BCB), or hexamethyldisiloxane (HMDSO) may be used as a material for forming the third-color quantum dot layer 435.

FIG. 6 is a schematic conceptual diagram showing light extraction regions EAR from a side of a user of the display apparatus of FIG. 1 and FIG. 7. For example, FIG. 6 shows the light extraction regions EAR in the third pixel PX3 when the light extraction regions EAR are viewed from the upper surface 400a of the upper substrate 400. As shown in FIG. 6, the light extraction region EAR in the third pixel PX3 may have an octagonal shape.

As a result of experiments under different conditions, it can be seen that the optical efficiency was the highest in case that a length of an edge of the light extraction region EAR is the smallest in each pixel (or sub-pixel) using the quantum dot layer in the display apparatus. To minimize the length of the edge of the light extraction region EAR while the area of the light extraction region is consistent, the light extraction region EAR may be circular in a plan view. However, it is not easy to manufacture the light extraction region EAR to have a circular shape in a plan view during the manufacturing processes of the display apparatus.

In the display apparatus according to the embodiment, the light extraction region EAR in the third pixel PX3 in which the third light-emitting device is located may have an octagonal shape when viewed from the upper surface 400a of the upper substrate 400. The light extraction region EAR in the third pixel PX3 may be defined as a portion in which the 2-3-th opening 423 of the second-color color filter layer 420 and the third opening 503 of the bank 500 overlap each other. The third-color quantum dot layer 435 in the third opening 503 of the bank 500 may convert the light emitted from the second-color light emission layer of the third light-emitting device including the third pixel electrode 331 into the light of the third wavelength band, and the converted light may be discharged to the outside only through the 2-3-th opening 423 of the second-color color filter layer 420. Therefore, in the display apparatus according to the embodiment, the light extraction region EAR of the third pixel PX3, in which the third light-emitting device is provided, may have the octagonal shape that is similar to the circular shape when viewed from the upper surface 400a of the upper substrate 400. Accordingly, the length of the edge of the light extraction region EAR in the third pixel PX3 may be reduced to increase the optical efficiency.

As described above, in order for the light extraction region EAR in the third pixel PX3, in which the third light-emitting device is located, to have an octagonal shape (or roughly or substantially octagonal shape) similar to a circular shape when viewed in the direction perpendicular to the upper surface 400a of the upper substrate 400, each of the 2-3-th opening 423 of the second-color color filter layer 420 and the third opening 503 of the bank 500 may have a rectangular shape when viewed in the direction (z-axis direction) perpendicular to the lower surface 400b of the upper substrate 400. As shown in FIGS. 2 and 5, when viewed in the direction (z-axis direction) perpendicular to the lower surface 400b of the upper substrate 400, the 2-3-th opening 423 of the second-color color filter layer 420 and the third opening 503 of the bank 500 may each have a square shape. Also, when viewed in the direction (z-axis direction) perpendicular to the lower surface 400b of the upper substrate 400, an edge of the 2-3-th opening 423 of the second-color color filter layer 420 may be parallel to the edge of the third opening 503 of the bank 500 if the third opening 503 of the bank 500 is rotated 45° about a center of the third opening 503. Therefore, when viewed in the direction perpendicular to the upper surface 400a of the upper substrate 400, the light extraction region EAR of the third pixel PX3, in which the third light-emitting device is located, may have an octagonal shape similar to a circular shape.

The second-color color filter layer 420 may include the 2-1-th opening 421 exposing the first area A1 and the 2-3-th opening 423 exposing the third area A3, as shown in FIGS. 1, 2, and 7. The 2-1-th opening 421 may define a region of the first-color pixel and the 2-3-th opening 423 may define a region of the third-color pixel. The 1-2-th opening 412 of the first-color color filter layer 410 may define a region of the second-color pixel.

Color filter layers of at least two colors overlap each other among the first to third pixels PX1 to PX3. In FIGS. 1 and 7, the first-color color filter layer 410 and the second-color color filter layer 420 may be among the first to third pixel PX1 to PX3. The overlapping color filter layers may function as a black matrix. For example, when the first-color color filter layer 410 only transmits light having a wavelength within a range of about 450 nm to about 495 nm and the second-color color filter layer 420 only transmits light having a wavelength within a range of about 495 nm to about 570 nm, light having any wavelength may not travel through the first-color color filter layer 410 and the second-color color filter layer 420 that overlap each other, theoretically. If desired, in addition to the first-color color filter layer 410 and the second-color color filter layer 420, the third-color color filter layer 430 may overlap any other color filter layer among the pixels.

Figure 8:
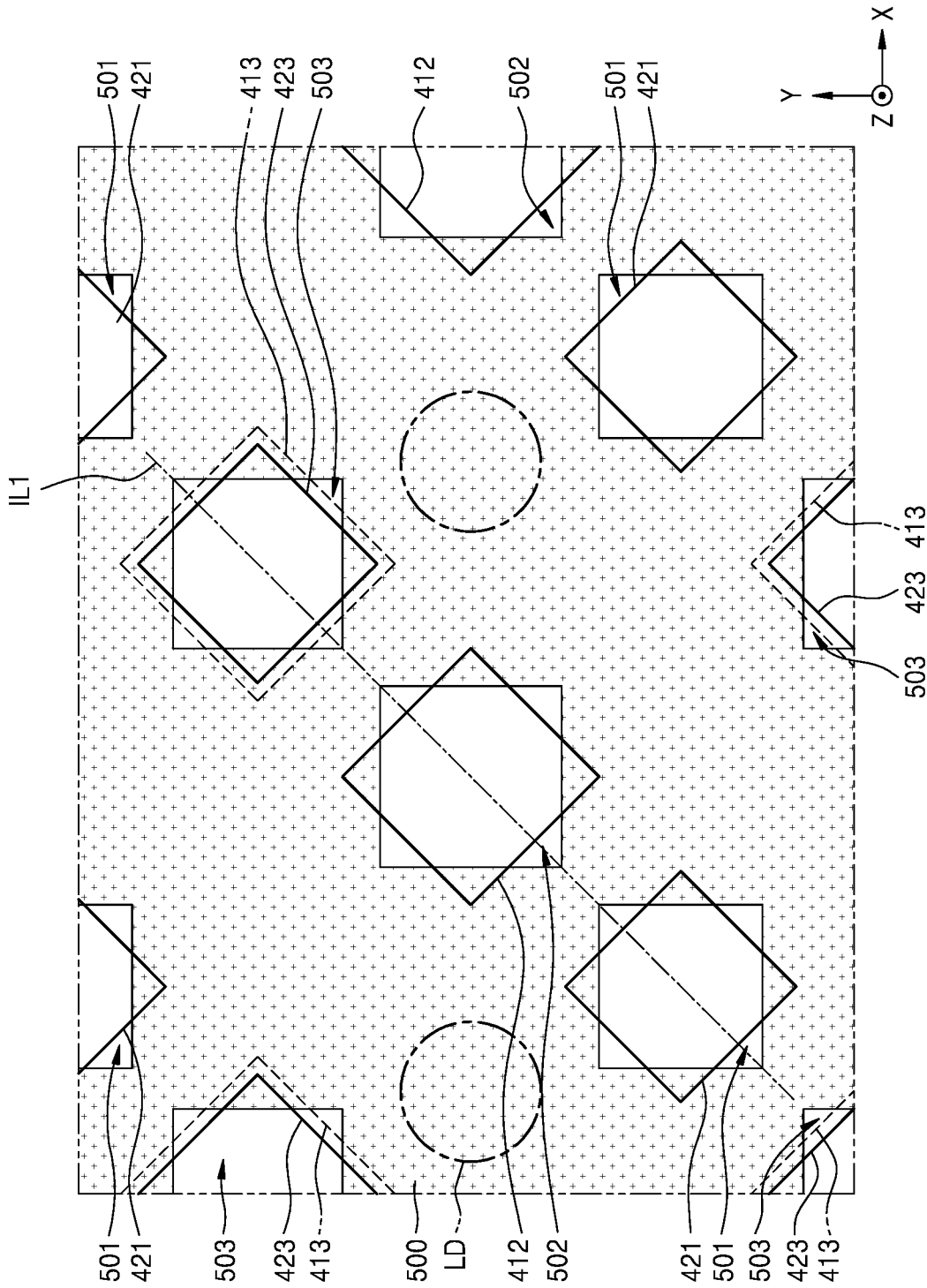
FIG. 8 is a schematic plan view showing a portion of a display apparatus according to another embodiment.

As described above, as a result of experiments under different conditions, it can be seen that the optical efficiency was the highest when a length of the edges of the light extraction region is the smallest in each pixel (or sub-pixel) using the quantum dot layer in the display apparatus. To this end, as shown in FIG. 8, which is a plan view showing a portion of the display apparatus according to another embodiment, the edge of the 2-1-th opening 421 of the second-color color filter layer 420 may correspond to the edge of the first opening 501 in the bank 500 if the first opening 501 is rotated by 45° about the center of the first opening 501, when viewed in the direction perpendicular to the lower surface 400b of the upper substrate 400. The light extraction region EAG of the first pixel PX1 may have an octagonal shape (or roughly or substantially octagonal shape) having the edges, the length of which may be reduced.

Likewise, when viewed in the direction perpendicular to the lower surface 400b of the upper substrate 400, the edge of the 1-2-th opening 412 of the first-color color filter layer 410 may correspond to the edge of the second opening 502 of the bank 500 if the second opening 502 is rotated by 45° about a center of the second opening 502. Also, when viewed in the direction perpendicular to the lower surface 400b of the upper substrate 400, the edge of the 2-3-th opening 423 of the second-color color filter layer 420 may correspond to the edge of the third opening 503 of the bank 500 if the third opening 503 is rotated by 45° about the center of the third opening 503. Therefore, the light extraction region EAB in the second pixel PX2 and the light extraction region EAR in the third pixel PX3 may each have an octagonal shape having edges, the length of which may be reduced.

As shown in FIGS. 1, 5, and 7, when viewed in the direction (z-axis direction) perpendicular to the lower surface 400b of the upper substrate 400, an area of the 1-3-th opening 413 in the first-color color filter layer 410 may be greater than that of the 2-3-th opening 423 of the second-color color filter layer 420. The third pixel PX3 may emit the light in the third wavelength band to the outside via the upper substrate 400, and thus the 2-3-th opening 423 of the second-color color filter layer 420 may define a region of the third color pixel. In consideration of a tolerance during manufacturing processes, the edges of the 1-3-th opening 413 of the first-color color filter layer 410 and the edge of the 2-3-th opening 423 in the second-color color filter layer 420 need not correspond to each other. Accordingly, when viewed in the direction (z-axis direction) perpendicular to the lower surface 400b of the upper substrate 400, the edges of the 2-3-th opening 423 in the second-color color filter layer 420 may be in the 1-3-th opening 413 of the first-color color filter layer 410.

Figure 9:
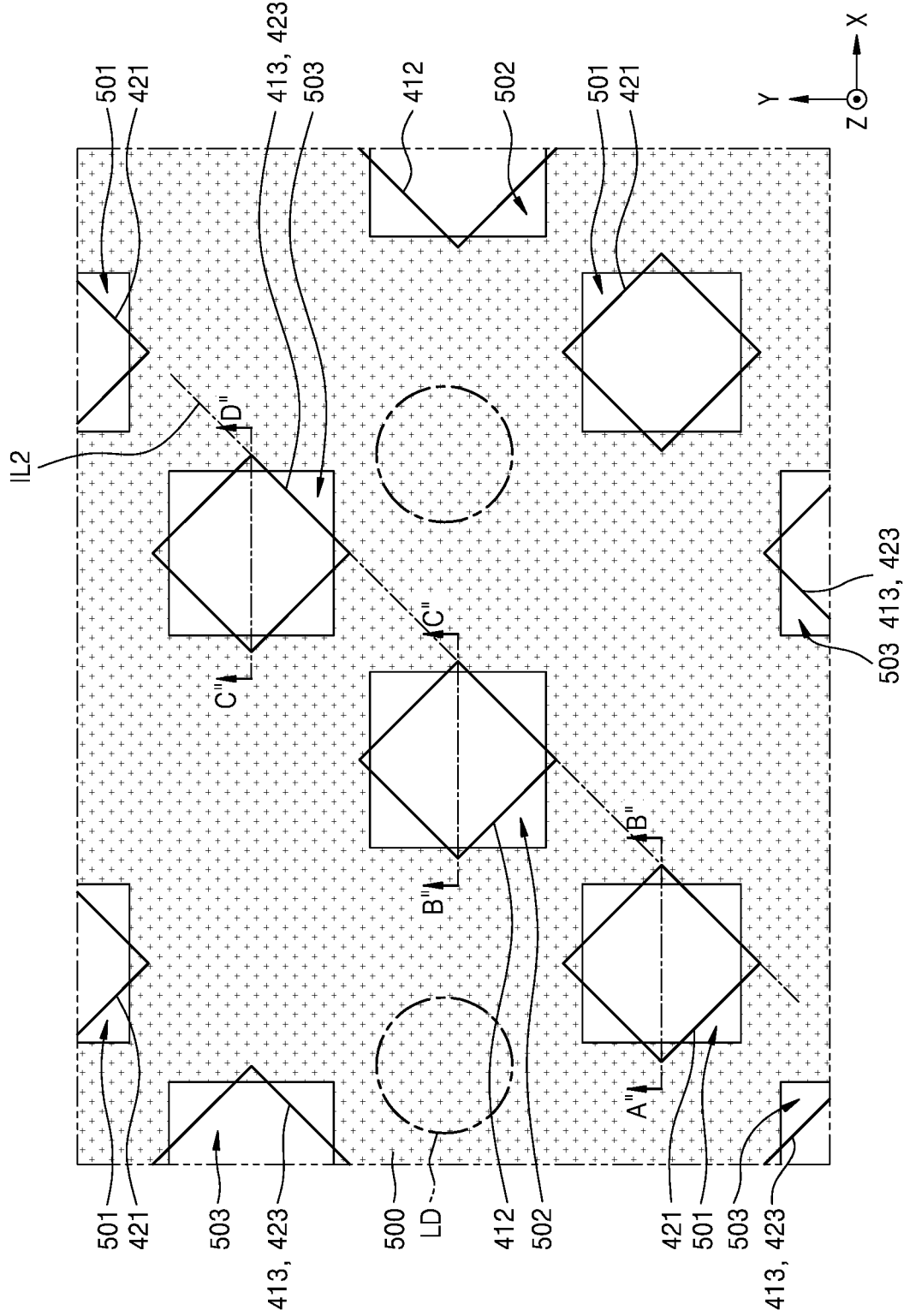
FIG. 9 is a schematic plan view showing a portion of a display apparatus according to another embodiment.
Figure 10:
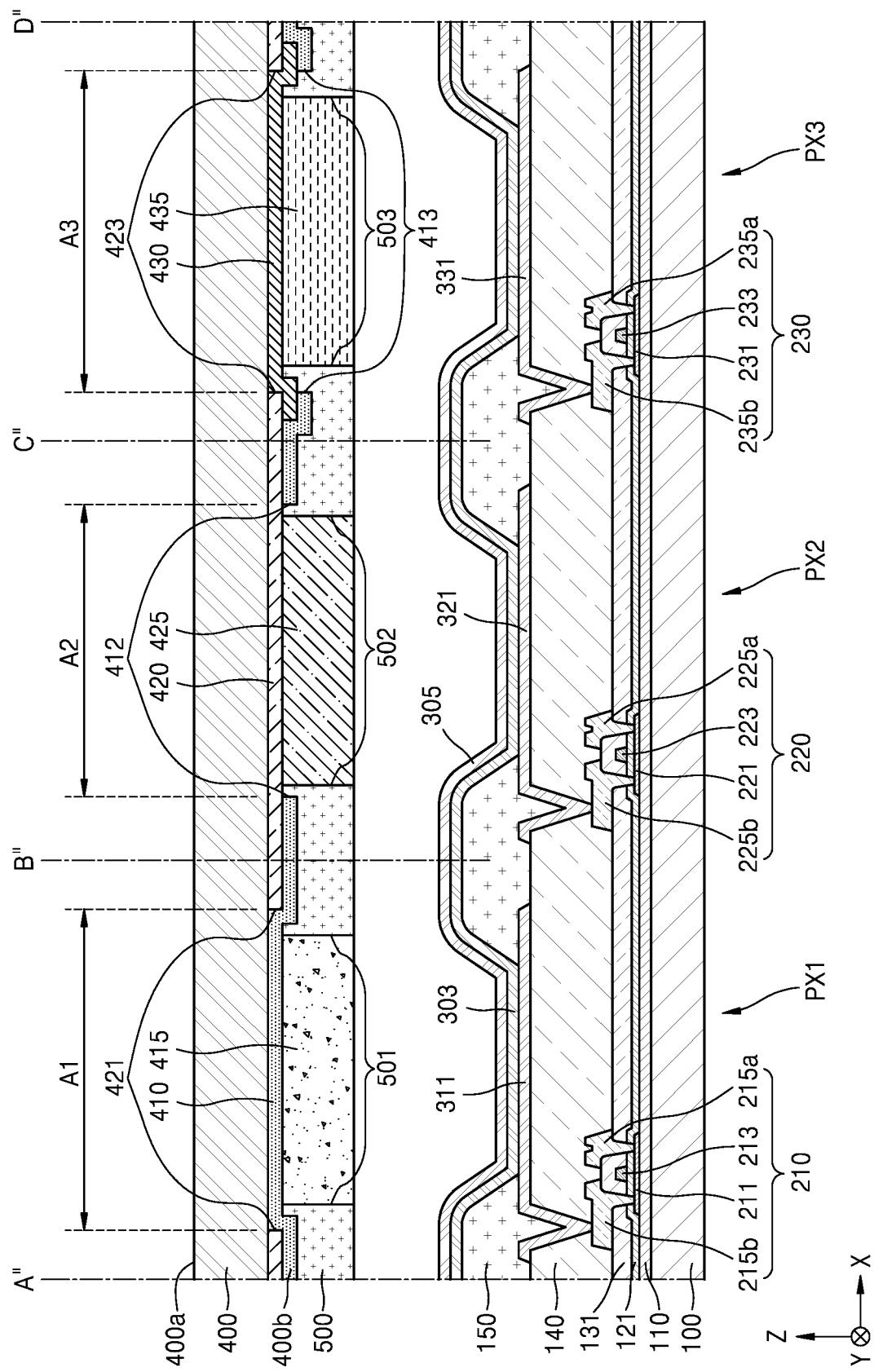
FIG. 10 is a schematic cross-sectional view of the display apparatus taken along lines A"-B", B"-C", and C"-D" of FIG. 9.

If desired, as shown in FIGS. 9 and 10, the edges of the 1-3-th opening 413 in the first-color color filter layer 410 may correspond to the edges of the 2-3-th opening 423 in the second-color color filter layer 420. FIG. 9 is a schematic plan view showing a portion of the display apparatus according to another embodiment, and FIG. 10 is a schematic cross-sectional view of the display apparatus taken along lines A"-B", B"-C", and C"-D" of FIG. 9. In this case, when viewed from the direction (z-axis direction) perpendicular to the lower surface 400b of the upper substrate 400, an area of the 1-3-th opening 413 in the first-color color filter layer 410 may be equal to that of the 2-3-th opening 423 in the second-color color filter layer 420.

Figure 11:
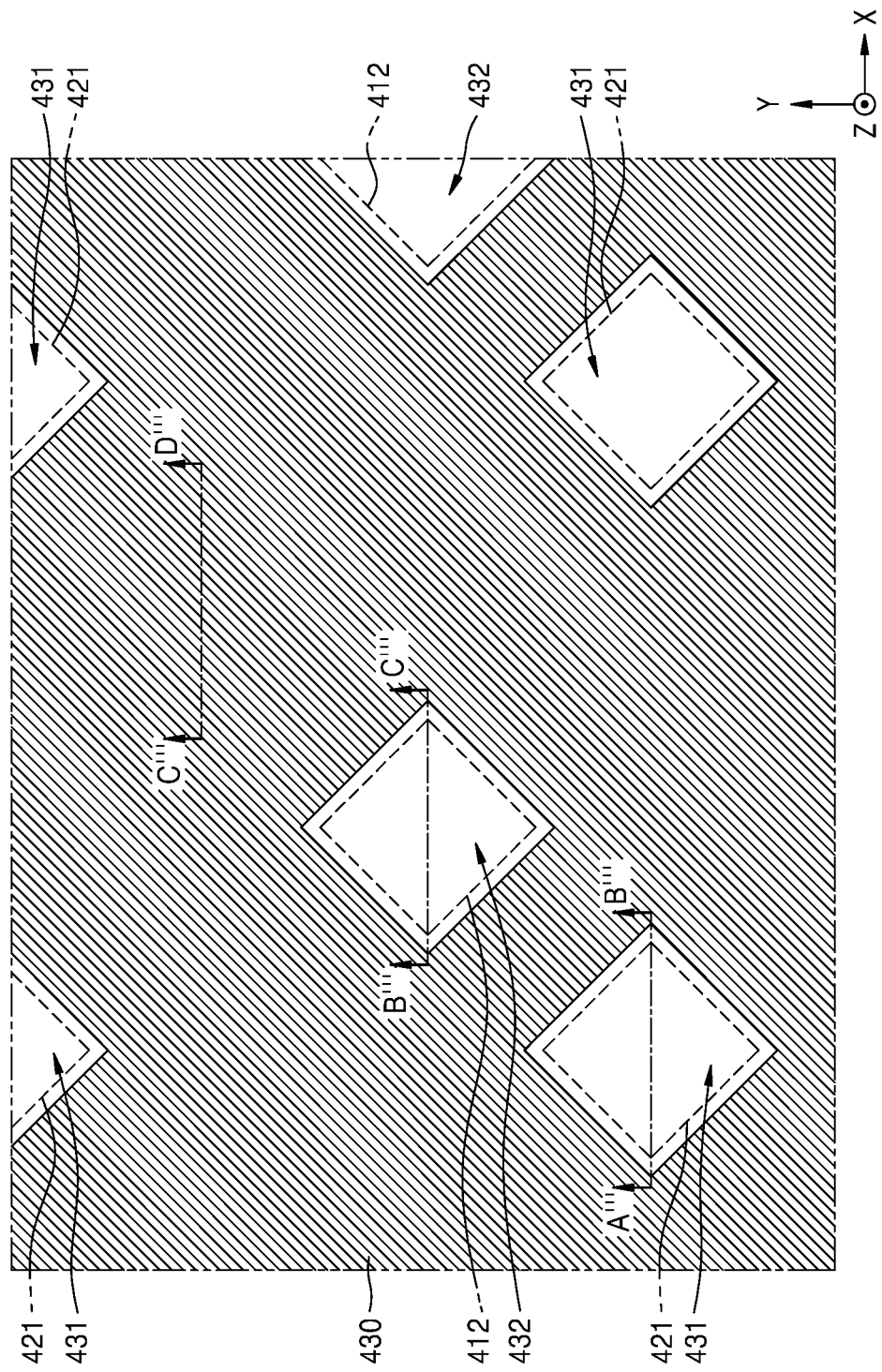
FIG. 11 is a schematic plan view showing a portion of a display apparatus according to another embodiment.
Figure 12:
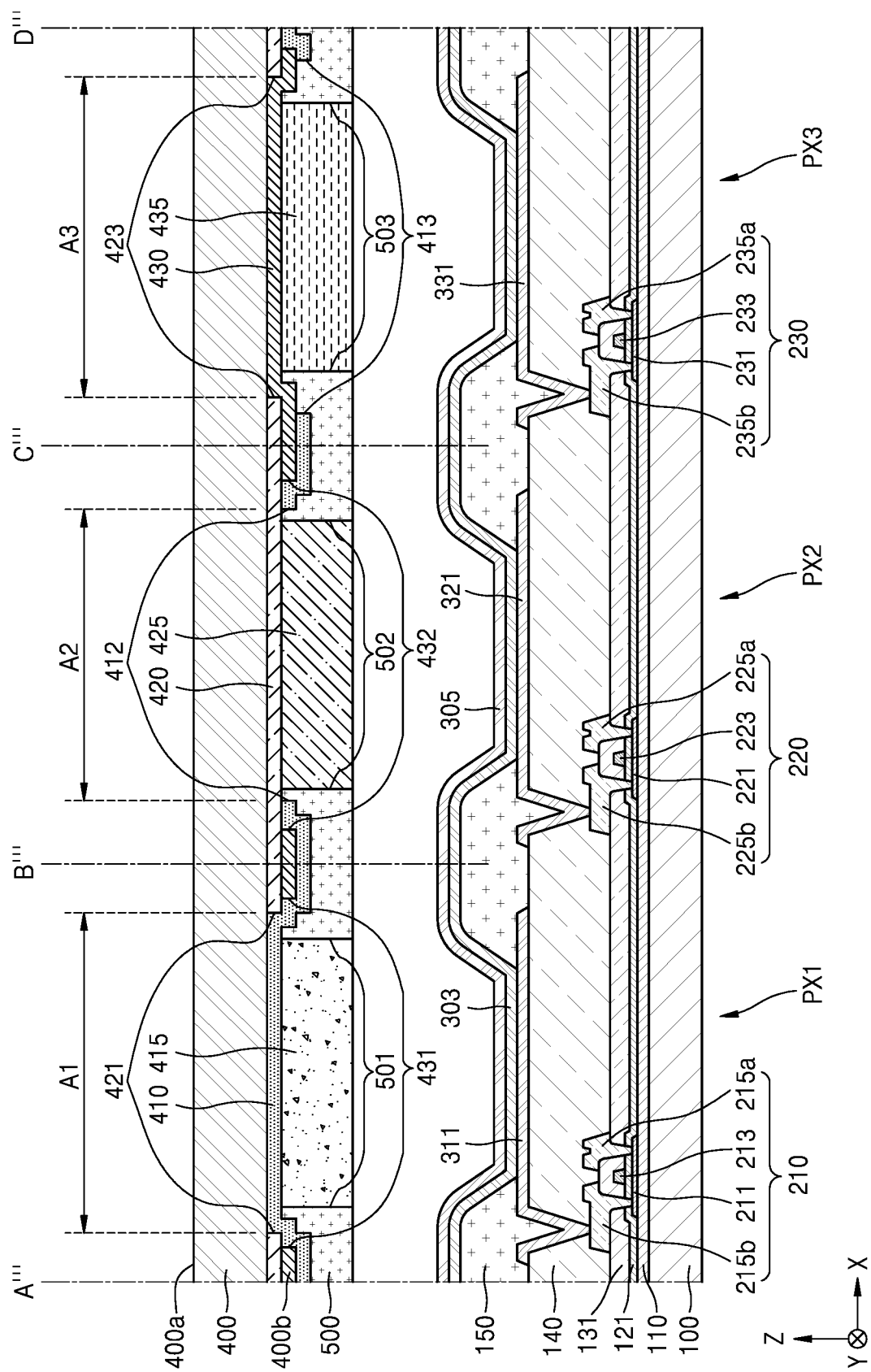
FIG. 12 is a schematic cross-sectional view of the display apparatus taken along lines A'''-B''', B'''-C''', and C'''-D''' of FIG. 11.

In FIGS. 1, 4, and 7, the third-color color filter layer 430 may only correspond to the third pixel PX3. However, the embodiments are not limited thereto. For example, as shown in FIGS. 11 and 12, the third-color color filter layer 430 may be on the entire surface of the upper substrate 400 similarly to the first-color color filter layer 410 or the second-color color filter layer 420 and may have a 3-1-th opening 431 corresponding to the first area A1 and a 3-2-th opening 432 corresponding to the second area A2. FIG. 11 is a schematic plan view showing a portion of display apparatus according to another embodiment, and FIG. 12 is a schematic cross-sectional view of the display apparatus taken along lines A'''-B''', B'''-C''', and C'''-D''' of FIG. 11.

In this case, when viewed in the direction (z-axis direction) perpendicular to the lower surface 400b of the upper substrate 400, taking into account the tolerance during the manufacturing processes, an area of the 3-1-th opening 431 in the third-color color filter layer 430 may be equal to or greater than the 2-1-th opening 421 of the second-color color filter layer 420 and an area of the 3-2-th opening 432 of the third-color color filter layer 430 may be equal to or greater than that of the 1-2-th opening 412 of the first-color color filter layer 410. The first pixel PX1 may emit light having a first color wavelength to the outside via the upper substrate 400, and the second pixel PX2 may emit light having a second color wavelength to the outside via the upper substrate 400. Thus, the 2-1-th opening 421 of the second-color color filter layer 420 may be defined as the region of the first color pixel, and the 1-2-th opening 412 of the first-color color filter layer 410 may be defined as the region of the second color pixel. When viewed in the direction (z-axis direction) perpendicular to the lower surface 400b of the upper substrate 400 (or in a plan view), the edge of the 2-1-th opening 421 may be in the 3-1-th opening 431, and the edge of the 1-2-th opening 412 may be in the 3-2-th opening 432, as shown in FIGS. 11 and 12.

Figure 13:
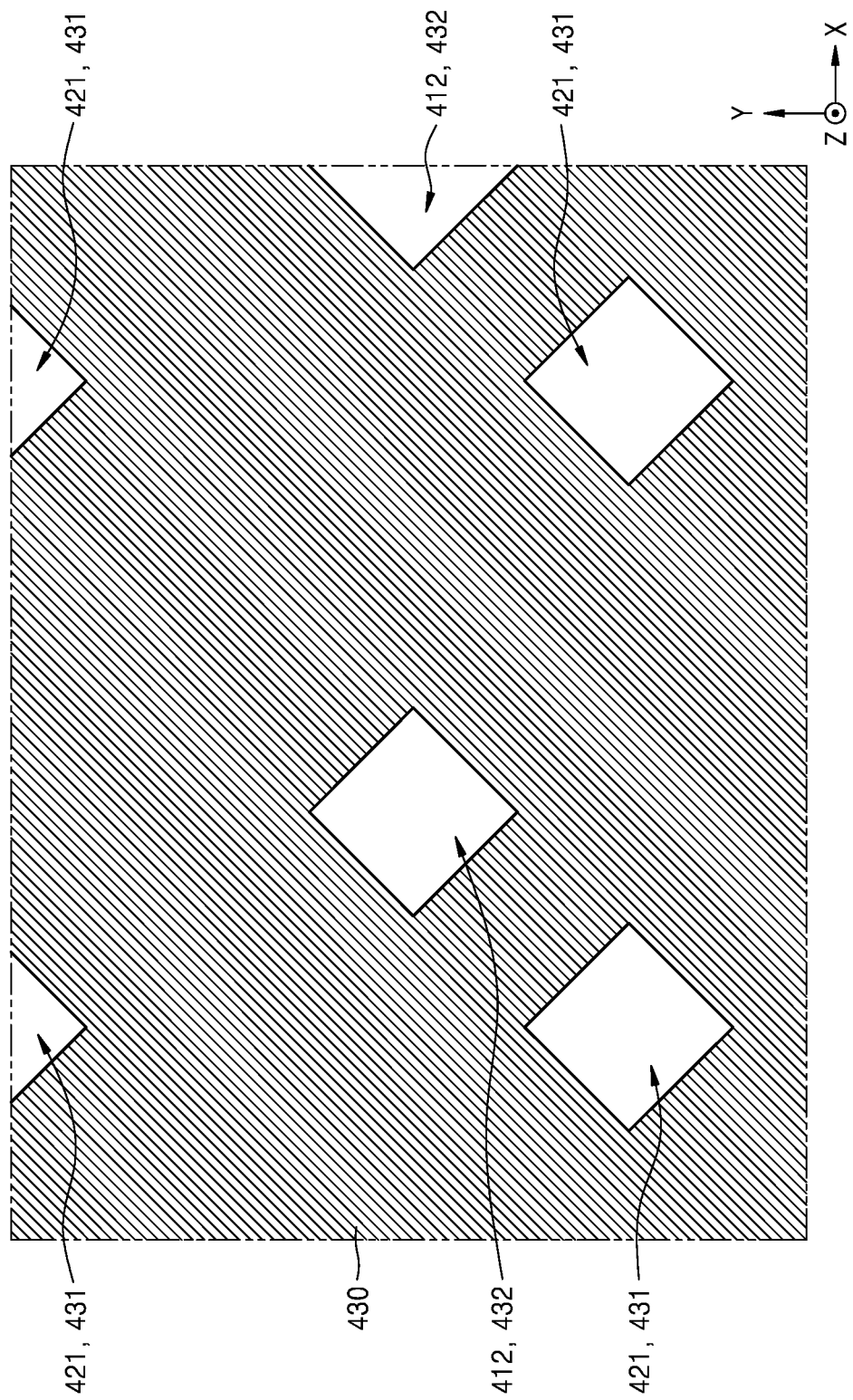
FIG. 13 is a schematic plan view showing a portion of a display apparatus according to another embodiment.

If desired, as shown in FIG. 13 that is a schematic plan view showing a portion of the display apparatus according to another embodiment, the edges of the 1-2-th opening 412 of the first-color color filter layer 410 may correspond to the edges of the 3-2-th opening 432 of the third-color color filter layer 430, and the edges of the 2-1-th opening 421 of the second-color color filter layer 420 may correspond to the edges of the 3-1-th opening 431 of the third-color color filter layer 430.

Figure 14:
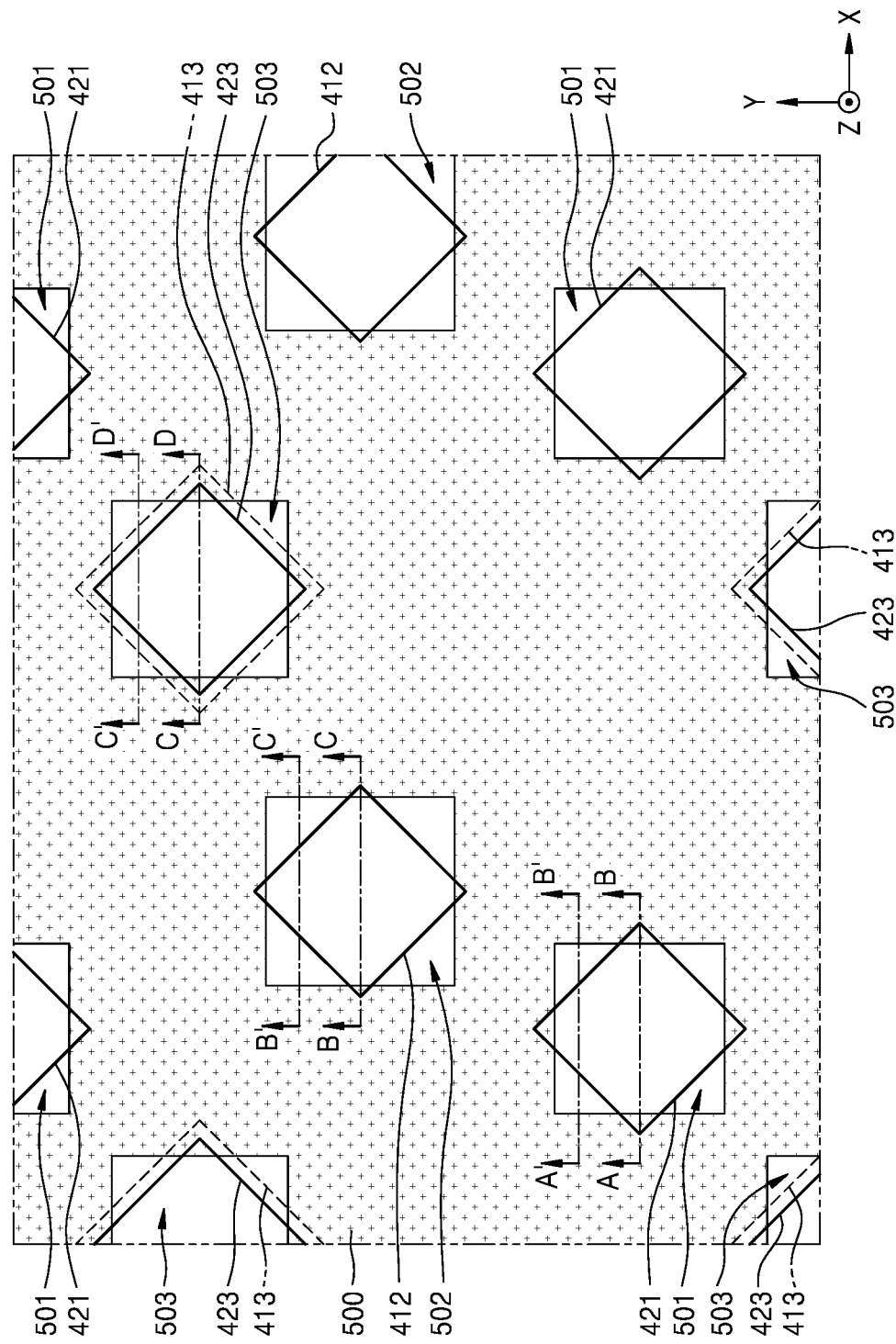
FIG. 14 is a schematic plan view showing a portion of a display apparatus according to another embodiment.

In FIGS. 5, 8, and 9, it is shown that the 2-1-th opening 421, the 1-2-th opening 412, and the 1-3-th opening 413 are on a straight line. However, the embodiments are not limited thereto. For example, as shown in FIG. 14 that is a schematic plan view showing a portion of the display apparatus according to another embodiment, a center of the 1-2-th opening 412 may be out of a straight line that connects a center of the 2-1-th opening 421 and that of the 1-3-th opening 413.

The first to third-color color filter layers 410, 420, and 430 may function to reduce external light reflection in the display apparatus. For example, in case that the external light reaches the first-color color filter layer 410, only the light having a predetermined wavelength as described above may travel through the first-color color filter layer 410, and light having other wavelengths may be absorbed by the first-color color filter layer 410. Therefore, only the light having the predetermined wavelength as described above of the external light incident to the display apparatus may travel through the first-color color filter layer 410, and a portion of the light may be reflected by the opposite electrode 305 or the first pixel electrode 311 under the first-color color filter layer 410 and discharged to the outside. As a result, only a portion of the external light incident to the space in which the first pixel PX1 is located may be reflected to the outside, and thus, the external light reflection may be reduced. The above description may also apply to the second-color color filter layer 420 and the third-color color filter layer 430.

In the description above, the second wavelength band may be in a range of about 450 nm to about 495 nm, the first color wavelength band may be in a range of about 495 nm to about 570 nm, and the third color wavelength band may be in a range of about 630 nm to about 780 nm. However, the embodiments are not limited thereto. For example, the first color wavelength band may be in a range of about 630 nm to about 780 nm, and the third color wavelength band may be in a range of about 495 nm to about 570 nm.

Because the external light of the second color wavelength band, that is, about 450 nm to about 495 nm, has the greatest intensity, the second-color color filter layer 420 of the first to third-color color filter layers 410, 420, and 430 may be closest to the lower surface 400b of the upper substrate 400 to make a similar environment to the external light. The color filter layer transmitting the light having a wavelength band of about 495 nm to about 570 nm may be relatively closer to the lower surface 400b of the upper substrate 400, rather than the color filter layer transmitting the light having a wavelength band of about 630 nm to about 780 nm. This is because human eyes are more sensitive to the light having a wavelength band of about 495 nm to about 570 nm.

Figure 15:
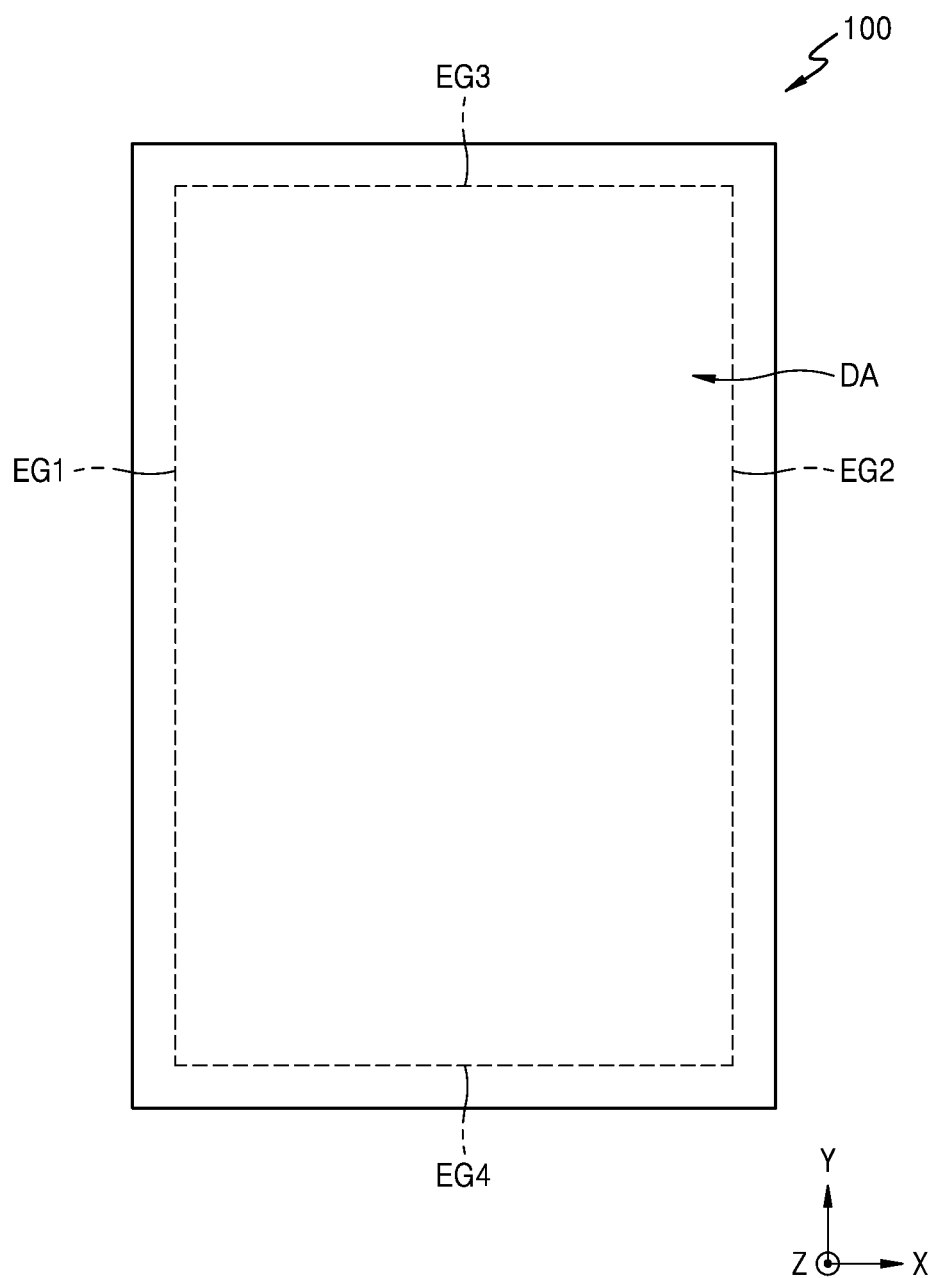
FIG. 15 is a schematic plan view showing a portion of a display apparatus according to another embodiment.

FIG. 15 is a schematic plan view showing a portion of the display apparatus according to another embodiment. FIG. 15 shows the lower substrate 100 included in the display apparatus. The lower substrate 100 may include a display area DA, and the display area DA may have four edges. In detail, the display area DA may include a first edge EG1, a second edge EG2 facing the first edge EG1 and parallel to the first edge EG1, a third edge EG3 connecting an end of the first edge EG1 in the y-axis direction to an end of the second edge EG2 in the y-axis direction, and a fourth edge EG4 connecting an opposite end of the first edge EG1 in the y-axis direction to an opposite end of the second edge EG2 in the y-axis direction. For example, the first edge EG1 and the second edge EG2 may be parallel to the y axis, and the third edge EG3 and the fourth edge EG4 may be parallel to the x axis.

In FIG. 15, the lower substrate 100 may have a shape similar to that of the display area DA. However, the embodiments are not limited thereto. For example, a portion of the lower substrate 100 may be bent.

The first to third light-emitting devices may be on the lower substrate 100, e.g., in the display area DA of the lower substrate 100. The first to third light-emitting devices may include emission layers that emit light in the same wavelength band. For example, as described above, the first to third light-emitting devices may be an organic light-emitting device, and each of the first to third light-emitting devices may include the intermediate layer 303 including the second-color light emission layer. The upper substrate 400 may be above the lower substrate 100 such that the first to third light-emitting devices are disposed therebetween, as shown, e.g., in FIGS. 1, 7.

The second-color color filter layer 420 may be on a surface of the upper substrate 400, the surface facing the lower substrate 100. The second-color color filter layer 420 may include the 2-1-th opening 421 and the 2-3-th opening 423, and shapes and locations of the 2-1-th opening 421 and the 2-3-th opening 423 may be identical to those shown in FIG. 8. For example, when viewed in the direction (z-axis direction) perpendicular to the lower surface 400b of the upper substrate 400, the 2-1-th opening 421 may overlap the first light-emitting device, but the edge of the 2-1-th opening 421 may not be parallel to the first to fourth edges EG1 to EG4. The 2-3-th opening 423 may overlap the third light-emitting device, but the edge of the 2-3-th opening 423 may not be parallel to the first to fourth edges EG1 to EG4.

The first-color color filter layer 410 may be on a surface of the upper substrate 400, the surface facing the lower substrate 100. The first-color color filter layer 410 may fill the 2-1-th opening 421 of the second-color color filter layer 420. The first-color color filter layer 410 may include the 1-2-th opening 412 and the 1-3-th opening 413, and shapes and locations of the 1-2-th opening 412 and the 1-3-th opening 413 may be identical to shown in FIG. 8. For example, when viewed in the direction (z-axis direction) perpendicular to a lower surface 400b of the upper substrate 400, the 1-2-th opening 412 may overlap the first light-emitting device, but the edges of the 1-2-th opening 412 may not be parallel to the first to fourth edges EG1 to EG4. The 1-3-th opening 413 may overlap the third light-emitting device, but the edges of the 1-3-th opening 413 may not be parallel to the first to fourth edges EG1 to EG4.

The third-color color filter layer 430 may be on the surface of the upper substrate 400, facing the lower substrate 100. The third-color color filter layer 430 may fill the 2-3-th opening 423 and the 1-3-th opening 413.

The bank 500 may be between the first to third-color color filter layers 410, 420, and 430 and the lower substrate 100. When viewed in the direction (z-axis direction) perpendicular to the lower surface 400b of the upper substrate 400, the bank 500 may include the first opening 501, the second opening 503, and the third opening 503. The first opening 501 may overlap the first light-emitting device and may have edges that are parallel to the first to fourth edges EG1 to EG4. The second opening 502 may overlap the second light-emitting device and may have edges that are parallel to the first to fourth edges EG1 to EG4. The third opening 503 may overlap the third light-emitting device and may have edges that are parallel to the first to fourth edges EG1 to EG4.

The quantum dot layers may fill two of the first to third openings 501 to 503. For example, as shown in FIGS. 1 and 7, the quantum dot layers may include the first-color quantum dot layer 415 filling the first opening 501 and the third-color quantum dot layer 435 filling the third opening 503.

As shown in FIG. 8, a virtual straight line IL1 connecting the center of the 2-1-th opening 421 to the center of the 2-3-th opening 423 of the second-color color filter layer 420 may not be parallel to the first and third edges EG1 and EG3 of the display area DA. The virtual straight line IL1 connecting the center of the 1-2-th opening 412 to the center of the 1-3-th opening 413 of the first-color color filter layer 410 may not be parallel to the first and third edges EG1 and EG3 of the display area DA. The reason is that the edges of each of the first to third openings 501 to 503 of the bank 500 are parallel to the first to fourth edges EG1 to EG4.

As shown in FIG. 9, a part of the edges of the 2-1-th opening 421 and a part of the edges of the 2-3-th opening 423 in the second-color color filter layer 420 may be on a same virtual straight line IL2. A part of the edges of the 1-2-th opening 412 and a part of the edges of the 1-3-th opening 413 in the first-color color filter layer 410 may also be on the virtual straight line IL2. The virtual straight line IL2 may not be parallel to the first and second edges EG1 and EG3. This is because the edges of each of the first to third openings 501 to 503 of the bank 500 are parallel to the first to fourth edges EG1 to EG4.

Unlike in FIG. 9, even in case that a part of the edges of the 2-1-th opening 421 and a part of the edges of the 2-3-th opening 423 in the second-color color filter layer 420 are on the same virtual line IL2, the edges of the 1-2-th opening 412 may not include a part on the virtual line IL2. This is because the 1-2-th opening 412 may be out of a line connecting the 2-1-th opening 421 to the 2-3-th opening 423, as shown in FIG. 14.

In either case, when viewed in the direction (z-axis direction) perpendicular to the lower surface 400b of the upper substrate 400, each of the 2-1-th opening 421, the 2-3-th opening 423, the 1-2-th opening 412, and the 1-3-th opening 413 may have a rectangular shape. The edge of each of the 2-1-th opening 421, the 2-3-th opening 423, the 1-2-th opening 412, and the 1-3-th opening 413 may be parallel to the first opening 501 of the bank 500 if the first opening 501 is rotated by 45° about the center of the first opening 501.

When viewed in the direction (z-axis direction) perpendicular to the lower surface 400b of the upper substrate 400, an area of the 2-3-th opening 423 of the second-color color filter layer 420 may be equal to that of the 2-1-th opening 421. As another example, when viewed in the direction (z-axis direction) perpendicular to the lower surface 400b of the upper substrate 400, an area of the 2-3-th opening 423 of the second-color color filter layer 420 may be equal to that of the 1-2-th opening 412 of the first-color color filter layer 410.

Figure 16:
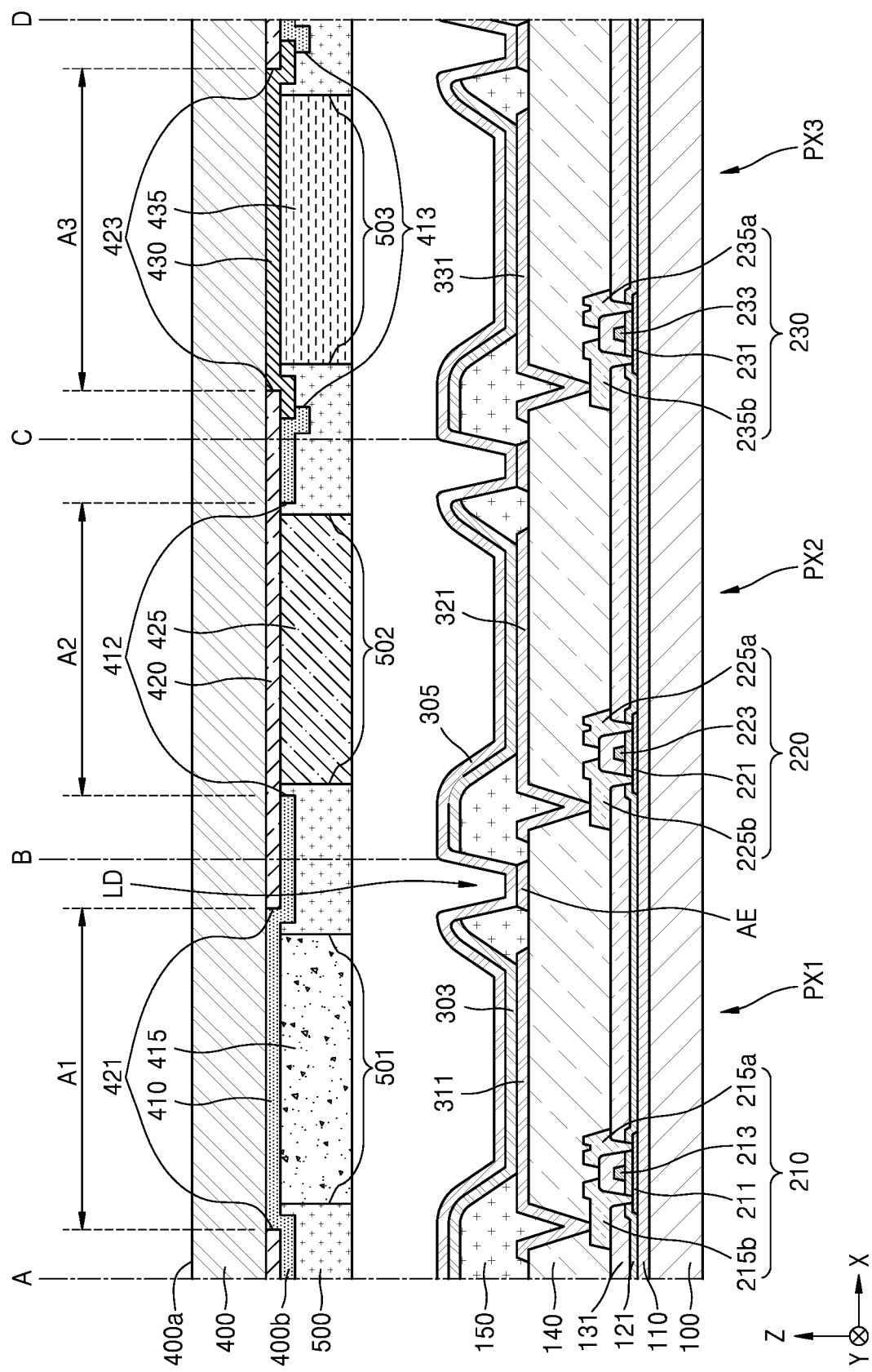
FIG. 16 is a schematic plan view showing a portion of a display apparatus according to another embodiment.

FIG. 16 is a schematic plan view showing a portion of a display apparatus according to another embodiment. The display apparatus according to the embodiment may be different from the display apparatus described above with reference to FIG. 1, etc. at least in that the display apparatus may further include an auxiliary electrode AE. For example, the auxiliary electrode AE and the pixel electrode 311 may be on the same layer etc., and may be manufactured simultaneously by using the same material to have the same layered structure as that of the first pixel electrode 311, etc. The pixel defining layer 150 may have an opening exposing the auxiliary electrode AE. The intermediate layer 303 may be also on the auxiliary electrode AE, and thus the auxiliary electrode AE may be irradiated with a laser beam before forming the opposite electrode 305 to remove the intermediate layer 303 on the auxiliary electrode AE. Next, in case that the opposite electrode 305 is formed, the opposite electrode 305 may electrically contact the auxiliary electrode AE as shown in FIG. 16. As mentioned above, a voltage drop in the opposite electrode 305 that is integrally formed in the display area DA may be prevented or significantly reduced. A laser drilling position LD in which the opposite electrode 305 electrically contacts the auxiliary electrode AE may be between the openings of the color filter layer, for example, the first to third openings 501 to 503 of the bank 500 as shown in FIGS. 8 and 9.

According to the abovementioned embodiments of the disclosure, the display apparatus having an improved efficiency may be implemented. However, the scope of the disclosure is not limited to the above effects.

It should be understood that the embodiments described herein should be considered in a descriptive sense only and not for purposes of limitation. Descriptions of features or aspects within each embodiment should typically be considered as available for other similar features or aspects in other embodiments. While the embodiments have been described with reference to the figures, it will be understood by those of ordinary skill in the art that various changes in form and details may be made therein without departing from the spirit and scope of the disclosure.

What is claimed is:
1. A display apparatus comprising:
a lower substrate;
a first light-emitting device on the lower substrate, the first light-emitting device including a second-color emission layer;

an upper substrate above the lower substrate with the first light-emitting device disposed between the upper substrate and the lower substrate, the upper substrate including a first area corresponding to the first light-emitting device;

a second-color color filter layer on a lower surface of the upper substrate, wherein
the lower surface faces the lower substrate, and
the second-color color filter layer includes a first opening exposing the first area;

a first-color color filter layer comprising a portion filling the first opening and a portion on a lower surface of the second-color color filter layer, wherein the lower surface of the second-color color filter layer faces the lower substrate;

a bank between the first-color and second-color color filter layers and the lower substrate, the bank including a second opening corresponding to the first area; and a first-color quantum dot layer filling the second opening, wherein the second opening includes a portion overlapping the first opening and a portion outside the first opening in a plan view.

2. The display apparatus of claim 1, wherein the first opening includes a portion overlapping the second opening and a portion outside the second opening in the plan view.

3. The display apparatus of claim 2, wherein each of the first opening and the second opening has a rectangular shape in the plan view.

4. The display apparatus of claim 2, wherein each of the first opening and the second opening has a square shape in the plan view.

5. The display apparatus of claim 4, wherein if the second opening is rotated by 45° about a center of the second opening, edges of the second opening are parallel to edges of the first opening in the plan view.

6. The display apparatus of claim 4, wherein if the second opening is rotated by 45° about a center of the second opening, edges of the second opening correspond to edges of the first opening in the plan view.

7. The display apparatus of claim 1, further comprising a second light-emitting device on the lower substrate, the second light-emitting device including a second-color emission layer, wherein
the second-color color filter layer overlaps a second area of the upper substrate, the second area corresponding to the second light-emitting device,
the first-color color filter layer includes a third opening corresponding to the second area,
the bank includes a fourth opening corresponding to the second area, and
the fourth opening includes a portion overlapping the third opening and a portion outside the third opening in the plan view.

8. The display apparatus of claim 7, wherein the third opening includes a portion overlapping the fourth opening and a portion outside the fourth opening in the plan view.

9. The display apparatus of claim 8, wherein each of the third opening and the fourth opening has a rectangular shape in the plan view.

10. The display apparatus of claim 8, wherein each of the third opening and the fourth opening has a square shape in the plan view.

11. The display apparatus of claim 10, wherein if the fourth opening is rotated by 45° about a center of the fourth opening, edges of the fourth opening are parallel to edges of the third opening in the plan view.

12. The display apparatus of claim 10, wherein if the fourth opening is rotated by 45° about a center of the fourth opening, edges of the fourth opening correspond to edges of the third opening in the plan view.

13. The display apparatus of claim 7, further comprising a third light-emitting device on the lower substrate, the third light-emitting device including a second-color emission layer, wherein
the second-color color filter layer includes a fifth opening exposing a third area of the upper substrate, the third area corresponding to the third light-emitting device,
the first-color color filter layer includes a sixth opening corresponding to the third area,
the bank includes a seventh opening corresponding to the third area, and
the seventh opening includes a portion overlapping the fifth opening and a portion outside the fifth opening in the plan view.

14. The display apparatus of claim 13, wherein the fifth opening includes a portion overlapping the seventh opening and a portion outside the seventh opening in the plan view.

15. The display apparatus of claim 14 each of the fifth opening and the seventh opening has a rectangular shape in the plan view.

16. The display apparatus of claim 14, wherein each of the fifth opening and the seventh opening has a square shape in the plan view.

17. The display apparatus of claim 16, wherein if the seventh opening is rotated by 45° about a center of the seventh opening, edges of the seventh opening are parallel to edges of the fifth opening in the plan view.

18. The display apparatus of claim 16, wherein if the seventh opening is rotated by 45° about a center of the seventh opening, edges of the seventh opening correspond to edges of the fifth opening in the plan view.

19. The display apparatus of claim 13, wherein an area of the sixth opening is equal to or greater than an area of the fifth opening in the plan view.

20. The display apparatus of claim 13, wherein edges of the sixth opening correspond to edges of the fifth opening in the plan view.

21. The display apparatus of claim 13, wherein edges of the fifth opening are in the sixth opening in the plan view.

22. The display apparatus of claim 13, further comprising:
a third-color color filter layer filling the fifth opening; and
a third-color quantum dot layer filling the seventh opening.

23. The display apparatus of claim 22, wherein the third-color color filter layer includes:
an eighth opening corresponding to the first area; and
a ninth opening corresponding to the second area.

24. The display apparatus of claim 23, wherein in the plan view,
an area of the eighth opening is equal to or greater than an area of the first opening, and
an area of the ninth opening is equal to or greater than an area of the third opening.

25. The display apparatus of claim 23, wherein in the plan view,
edges of the eighth opening correspond to edges of the first opening, and
edges of the ninth opening correspond to edges of the third opening.

26. The display apparatus of claim 23, wherein in the plan view,
edges of the first opening are in the eighth opening, and
edges of the third opening are in the ninth opening.

27. A display apparatus comprising:
a lower substrate comprising a display area including a first edge, a second edge, a third edge, and a fourth edge, the second edge facing the first edge, the third edge connecting an end of the first edge to an end of the second edge, and the fourth edge connecting another end of the first edge to another end of the second edge;
a first light-emitting device, a second light-emitting device, and a third light-emitting device in the display area on the lower substrate, each of the first to third light-emitting devices including an emission layer emitting light having a wavelength within a wavelength band;
an upper substrate above the lower substrate with the first to third light-emitting devices disposed between the upper substrate and the lower substrate;
a second-color color filter layer on a lower surface of the upper substrate, the lower surface of the upper substrate facing the lower substrate, wherein the second-color color filter layer includes a first opening overlapping the first light-emitting device and including edges that are not parallel to the first to fourth edges, and a second opening overlapping the third light-emitting device and including edges that are not parallel to the first to fourth edges;
a first-color color filter layer on the lower surface of the upper substrate, wherein the first-color color filter layer fills the first opening and includes a third opening and fourth opening, the third opening overlapping the second light-emitting device and including edges that are not parallel to the first to fourth edges in a plan view, the fourth opening overlapping the third light-emitting device and including edges that are not parallel to the first to fourth edges in the plan view;
a third-color color filter layer on the lower surface of the upper substrate, the third-color color filter layer filling the second opening and the fourth opening;
a bank between the first to third-color color filter layers and the lower substrate, and including a fifth opening, a sixth opening, and a seventh opening, wherein the fifth opening overlaps the first light-emitting device and includes edges that are parallel to the first to fourth edges in the plan view, a sixth opening overlaps the second light-emitting device and includes edges that are parallel to the first to fourth edges in the plan view, and a seventh opening overlaps the third light-emitting device and includes edges that are parallel to the first to fourth edges in the plan view; and
quantum dot layers filling two of the fifth to seventh openings.

28. The display apparatus of claim 27, wherein
each of the first to third light-emitting devices includes a second-color emission layer, and
the quantum dot layers comprise a first-color quantum dot layer filling the fifth opening and a third-color quantum dot layer filling the seventh opening.

29. The display apparatus of claim 27, wherein a virtual straight line connecting a center of the first opening to a center of the second opening is not parallel to the first and third edges.

30. The display apparatus of claim 27, wherein
at least one of the edges of the first opening and at least one of the edges of the second opening are on a same virtual straight line, and
the virtual straight line is not parallel to the first and third edges.

31. The display apparatus of claim 30, wherein at least one of the edges of the third opening is on the virtual straight line.

32. The display apparatus of claim 30, wherein the edges of the third opening are not on the virtual straight line.

33. The display apparatus of claim 27, wherein each of the first opening, the second opening, the third opening, and the fourth opening has a rectangular shape in the plan view.

34. The display apparatus of claim 27, wherein if the fifth opening is rotated by 45° about a center of the fifth opening, edges of the fifth opening are parallel to the edges of each of the first opening, the second opening, the third opening, and the fourth opening in the plan view.

35. The display apparatus of claim 27, wherein an area of the second opening is equal to an area of the first opening in the plan view.

36. The display apparatus of claim 27, wherein an area of the second opening is equal to an area of the third opening in the plan view.

* * * * *